(12) United States Patent
Bangsaruntip et al.

(10) Patent No.: US 7,534,675 B2
(45) Date of Patent: May 19, 2009

(54) TECHNIQUES FOR FABRICATING NANOWIRE FIELD-EFFECT TRANSISTORS

(75) Inventors: Sarunya Bangsaruntip, Mount Kisco, NY (US); Guy Moshe Cohen, Mohegan Lake, NY (US); Katherine Lynn Saenger, Ossining, NY (US)

(73) Assignee: International Business Machiens Corporation, Armonk, NY (US)

( * ) Notice: Subject to any disclaimer, the term of this patent is extended or adjusted under 35 U.S.C. 154(b) by 0 days.

(21) Appl. No.: 11/850,644

(22) Filed: Sep. 5, 2007

(65) Prior Publication Data
US 2009/0061568 A1 Mar. 5, 2009

(51) Int. Cl.
*H01L 21/336* (2006.01)
(52) U.S. Cl. .............. 438/197; 438/178; 977/720; 977/742; 977/762; 977/938; 257/E23.141; 257/E21.177
(58) Field of Classification Search ............... 977/720, 977/938
See application file for complete search history.

(56) References Cited

U.S. PATENT DOCUMENTS 7,427,541 B2 * 9/2008 Datta et al. ................. 438/178
2005/0142766 A1 * 6/2005 Hareland et al. ............ 438/268

OTHER PUBLICATIONS

U.S. Appl. No. 11/519,176.
E. Tutuc, et al., "Realization of a Linear Germanium Nanowire p-n Junction," Nano Lett. 6(9):2070-4 (Sep. 2006).
B. Kalache et al., "Observation of Incubation Times in the Nucleation of Silicon Nanowires Obtained by the Vapor-Liquid-Solid Method," Jpn. J. Appl. Phys. vol. 45, No. 7, pp. L190-L193 (2006).
Y. Wang et al., "Inversion-Mode Operation of Thermally-Oxidized Modulation-Doped Silicon Nanowire Field Effect Transistor," Device Research Conference Digest, p. 175 (2006).
O. Hayden et al., "Fully Depleted Nanowire Field-Effect Transistor in Inversion Mode," Small 3, p. 230 (2007).
G.M. Cohen et al., "Nanowire Metal-Oxide-Semiconductor Field Effect Transistor with Doped Epitaxial Contacts for Source and Drain," Appl. Phys. Lett. 90, 233110 (2007).
E.I. Givargizov, Highly Anisotropic Crystals, pp. 93-97 (1987).
C. Yang, et al., "Encoding Electronic Properties by Synthesis of Axial Modulation-Doped Silicon Nanowires," Science, 310, 1304 (Nov. 2005).
Y. Wang et al., "Top-Gated Field Effect Devices Using Oxidized Silicon Nanowires," IEEE, pp. 159-160 (2005).

* cited by examiner

*Primary Examiner*—W. David Coleman
*Assistant Examiner*—Shaka Scarlett
(74) *Attorney, Agent, or Firm*—Vazken Alexanian; Michael J. Chang, LLC

(57) ABSTRACT

Techniques for the fabrication of field-effect transistors (FETs) having nanowire channels are provided. In one aspect, a method of fabricating a FET is provided comprising the following steps. A substrate is provided having a silicon-on-insulator (SOI) layer. At least one nanowire is deposited over the SOI layer. A sacrificial gate is formed over the SOI layer so as to cover a portion of the nanowire that forms a channel region. An epitaxial semiconductor material is selectively grown from the SOI layer that covers the nanowire and attaches the nanowire to the SOI layer in a source region and in a drain region. The sacrificial gate is removed. An oxide is formed that divides the SOI layer into at least two electrically isolated sections, one section included in the source region and the other section included in the drain region. A gate dielectric layer is formed over the channel region. A gate is formed over the channel region separated from the nanowire by the gate dielectric layer. A metal-semiconductor alloy is formed over the source and drain regions.

13 Claims, 15 Drawing Sheets

102

202

302

A-B CROSS-SECTION

C-D CROSS-SECTION

A-B CROSS-SECTION

C-D CROSS-SECTION

602

800

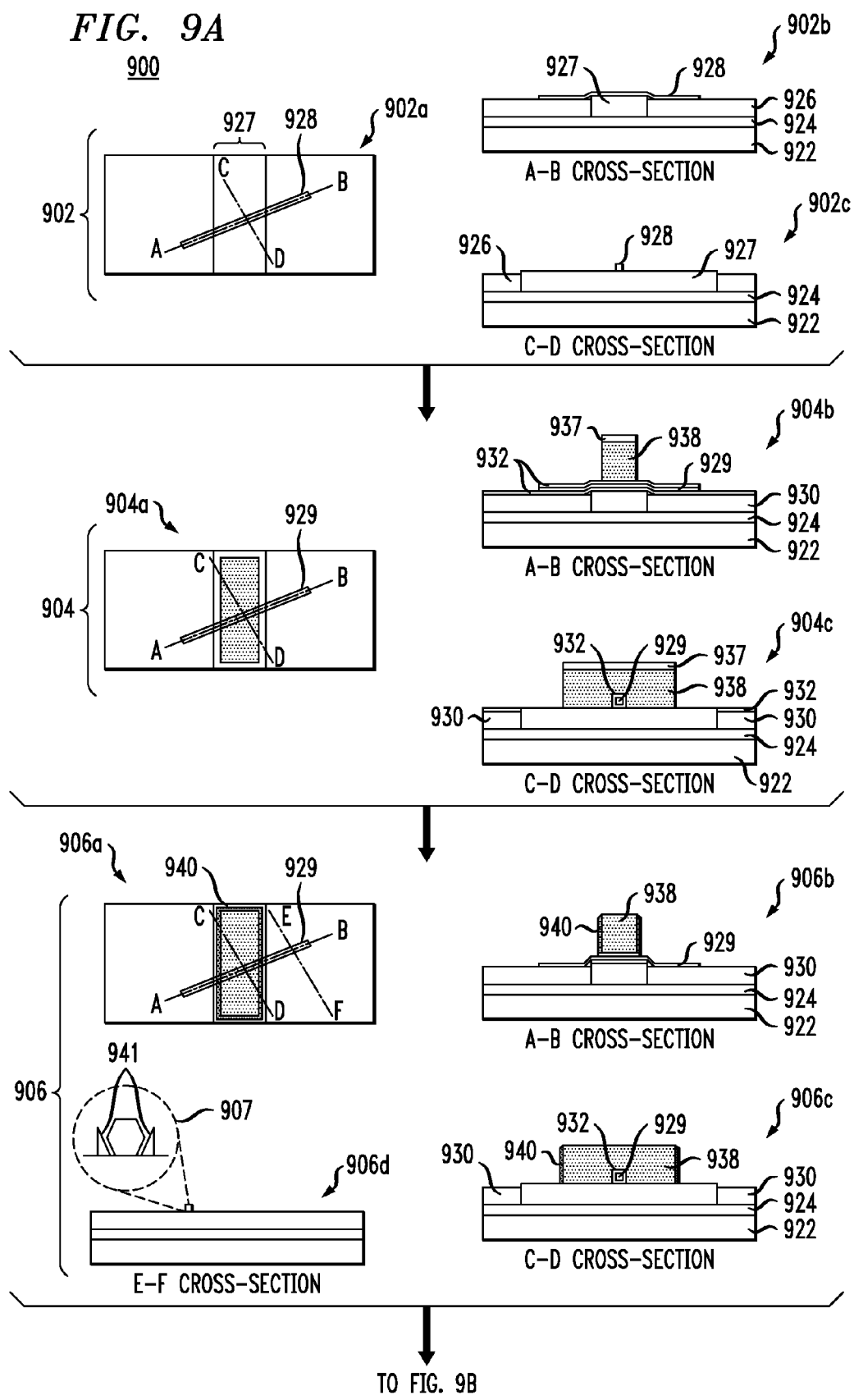

$$R_{on} = R_{ch} + R_{ext}$$

$$R_{on} = \frac{L}{W\mu_{eff}C_{ox}(V_g - V_t)} + R_{ext}$$

CONTACT RESISTIVITY
$R \cdot A = 1.1 - 2.7 \cdot 10^{-8} \ \Omega \cdot cm^2$

TECHNIQUES FOR FABRICATING NANOWIRE FIELD-EFFECT TRANSISTORS

CROSS-REFERENCE TO RELATED APPLICATIONS

This application is related to the commonly owned U.S. application Ser. No. 11/850,608, entitled "Nanowire Field-Effect Transistors," filed herewith on the same day of Sep. 5, 2007, the disclosure of which is incorporated herein by reference as fully set forth herein.

FIELD OF THE INVENTION

The present invention relates to field-effect transistors (FETs), and more particularly, to techniques for the fabrication of FETs having nanowire channels.

BACKGROUND OF THE INVENTION

Nanotechnology has gained widespread use in the semiconductor industry as a way to meet scaled technology requirements. For example, nanowires are currently being used to form the channel regions in field-effect transistors (FETs).

Integrating nanowires in FET devices, however, presents several notable challenges. First, trying to in-situ dope nanowires during their growth is difficult since dopants are incorporated into the nanowire from the gas-phase and/or by radial growth. See, for example, E. Tutuc, et al., "Realization of a Linear Germanium Nanowire p-n Junction," Nano Lett. 6(9):2070-4 (September 2006). For example, counter-doping of a lightly doped portion of a nanowire can occur if a following heavily doped segment is grown. Second, the onset for a doped region in an in-situ doped nanowire, due to growth incubation time, will exhibit variations corresponding to the delay in nucleation experienced for each nanowire. See, for example, B. Kalache et al., "Observation of Incubation Times in the Nucleation of Silicon Nanowires Obtained by the Vapor-Liquid-Solid Method," Jpn. J. Appl. Phys. Vol. 45, No. 7, pp. L190-L193 (2006). Third, heavy in-situ doping can lead to nanowire tapering, i.e., in germanium (Ge) nanowires, and loss of gold (Au) from the catalyst, i.e., in silicon (Si) nanowires doped with diborane. Fourth, even if segmented doping along a nanowire body can be achieved, there are no simple methods to align the contacts and the gate to each segment. Fifth, dopant variations make it hard to control doping in thin nanowires.

To build a nanowire FET, the nanowire should have an n-p-n (n-FET) or a p-n-p (p-FET) doping profile along its main axis. Several techniques have been proposed to achieve such a doping profile. The first technique involves in-situ doping of the nanowire during growth. See, for example, Y. Wang et al., "Inversion-Mode Operation of Thermally-Oxidized Modulation-Doped Silicon Nanowire Field Effect Transistor," Device Research Conference Digest, p. 175 (2006). The disadvantages of the in-situ doping technique were described above. The second approach is based on ion implantation. See, for example, O. Hayden et al., "Fully Depleted Nanowire Field-Effect Transistor in Inversion Mode," Small 3, p. 230 (2007). An ion implantation approach is disadvantageous in that it can only be used with thick nanowires (i.e., nanowires having diameters of greater than about 30 nanometers (nm)) since smaller nanowires will be amorphized and sputtered by the implant. Recrystallization of the doped regions may not be possible, due to the one-dimensional nature of the nanowire (because spontaneous recrystallization will dominate during solid phase epitaxy).

More recently, epitaxial doped contacts to nanowires were realized by epitaxially thickening the nanowire body in the source and drain regions of a FET device, i.e., analogous to the raised source/drain method used for thin silicon-on-insulator (SOI) FETs. See, for example, G. M. Cohen et al., "Nanowire Metal-Oxide-Semiconductor Field Effect Transistor with Doped Epitaxial Contacts for Source and Drain," Appl. Phys. Lett. 90, 233110 (2007). In this approach, non-selective ultra-high vacuum chemical vapor deposition (UHV-CVD) of silicon is used for epitaxy that templates from the body of a single crystal nanowire. Non-selective Si deposition, however, has several drawbacks. First, Si is deposited everywhere. As such, any excess Si that bridges the source and drain regions has to be removed to achieve electrical isolation. Second, only the Si that templates from the nanowire is a single crystal. Thus, at some distance from the nanowire the deposited Si will be poly-crystalline, i.e., poly-silicon (poly-Si). Poly-Si typically exhibits higher resistivity than single-crystal Si, thus increasing the overall contact resistance of the device.

Thus, there exists a need for improved nanowire FET devices and techniques for the fabrication thereof.

SUMMARY OF THE INVENTION

The present invention provides techniques for the fabrication of field-effect transistors (FETs) having nanowire channels. In one aspect of the invention, a method of fabricating a FET is provided. The method comprises the following steps. A substrate is provided having a silicon-on-insulator (SOI) layer. At least one nanowire is deposited over the SOI layer. A sacrificial gate is formed over the SOI layer so as to cover a portion of the nanowire that forms a channel region. An epitaxial semiconductor material is selectively grown from the SOI layer that covers the nanowire and attaches the nanowire to the SOI layer in a source region and in a drain region. The sacrificial gate is removed. An oxide is formed that divides the SOI layer into at least two electrically isolated sections, one section included in the source region and the other section included in the drain region. A gate dielectric layer is formed over the channel region. A gate is formed over the channel region separated from the nanowire by the gate dielectric layer. A metal-semiconductor alloy is formed over the source and drain regions.

In another aspect of the invention, another method of fabricating a FET is provided. The method comprises the following steps. A substrate is provided having a SOI layer. A trench is formed in the SOI layer that divides the SOI layer into at least two electrically isolated sections, one section included in a source region and the other section included in a drain region. At least one nanowire is deposited over the SOI layer so as to cross over the trench in the SOI layer. A gate dielectric layer is formed around the nanowire. A gate is formed that surrounds a portion of the nanowire that forms a channel region and is separated from the nanowire by the gate dielectric layer. Spacers are formed adjacent to the gate. An epitaxial semiconductor material is selectively grown from the SOI layer that covers the nanowire and attaches the nanowire to each section of the SOI layer. A metal-semiconductor alloy is formed over the source and drain regions.

In yet another aspect of the invention, yet another method of fabricating a FET is provided. The method comprises the following steps. A substrate is provided having a SOI layer. A shallow trench isolation (STI) region is formed in the SOI layer that divides the SOI layer into at least two electrically isolated sections, one section included in a source region and the other section included in a drain region. At least one nanowire is deposited over the SOI layer so as to cross over the STI region. A gate dielectric layer is formed over the nanowire. A gate is formed over a portion of the nanowire that forms a channel region, that is separated from the nanowire by the gate dielectric layer. Spacers are formed on one or more sides of the gate. An epitaxial semiconductor material is selectively grown from the SOI layer that covers the nanowire and attaches the nanowire to each section of SOI layer. A crystal structure is unified throughout at least a portion of the source and drain regions. A metal-semiconductor alloy is formed over the source and drain regions.

In still yet another aspect of the invention, still yet another method of fabricating a FET is provided. The method comprises the following steps. A substrate is provided having a SOI layer. At least one nanowire is deposited over the SOI layer. An oxide layer is deposited over the SOI layer, so as to cover the nanowire. A nitride layer is deposited over the oxide layer. A trench is formed through the nitride layer and the oxide layer so as to expose a portion of the nanowire that forms a channel region. An oxide is formed that divides the SOI layer into at least two electrically isolated sections, one section included in a source region and the other section included in a drain region. A gate dielectric layer is formed over the channel region. The trench is filled with at least one conductor material to form a gate. Spacers are formed adjacent to the gate. All but select portions of the oxide layer that are present below the spacers are removed. An epitaxial semiconductor material is selectively grown from the SOI layer that covers the nanowire and attaches the nanowire to each section of the SOI layer. A metal-semiconductor alloy is formed over the source and drain regions.

A more complete understanding of the present invention, as well as further features and advantages of the present invention, will be obtained by reference to the following detailed description and drawings.

BRIEF DESCRIPTION OF THE DRAWINGS

FIGS. 9A-C are diagrams illustrating yet another exemplary methodology for fabricating a FET having a nanowire channel according to an embodiment of the present invention;

DETAILED DESCRIPTION OF PREFERRED EMBODIMENTS

Figure 1:
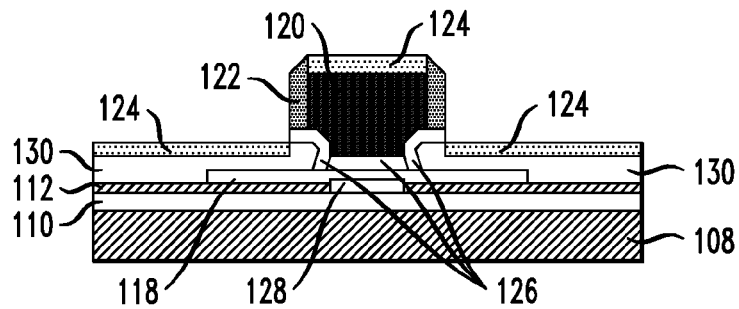
FIG. 1 is a diagram illustrating an exemplary field-effect transistor (FET) having a nanowire channel according to an embodiment of the present invention.

FIG. 1 is a diagram illustrating exemplary field-effect transistor (FET) 102 having a nanowire channel. For ease of depiction, the structures shown illustrated in FIG. 1 are not drawn to scale. Further, the cross-sectional view shown in FIG. 1 depicts a FET having a single nanowire channel. It is to be understood, however, that FET 102 may comprise multiple nanowire channels. For example, multiple nanowire channels can be used in applications requiring a higher current drive.

Namely, FET 102 comprises semiconductor substrate 108 having buried oxide (BOX) layer 110 and silicon-on-insulator (SOI) layer 112 over BOX layer 110. According to an exemplary embodiment, substrate 108 comprises silicon (Si). Optionally, substrate 108 can be doped if back-gating of the nanowire channel is desired. Namely, according to an exemplary embodiment (not shown), the substrate is conductive and serves as a gate conductor. BOX layer 110 can have a thickness of between about five nanometers (nm) and about 200 nm. A thinner BOX layer may be used, for example, when the nanowire channel is back-gated. SOI layer 112 can have a thickness of between about five nm and about 10 nm.

Nanowire 118 is present over SOI layer 112. According to an exemplary embodiment, nanowire 118 comprises a highly anisotropic semiconductor crystal, such as a highly anisotropic Si crystal. It is to be understood, however, that nanowire 118 can comprise any highly anisotropic semiconductor crystal, including, but not limited to, one or more of Si, germanium (Ge) and III-V semiconductors. As will be described below, the anisotropy of a nanowire is reflected by its external structure, i.e., morphology.

Gate 120 is present over nanowire 118. Gate 120 can comprise any suitable gate conductor material, including, but not limited to, one or more of doped poly-silicon (poly-Si), a metal, a metal alloy and a metal-semiconductor alloy. Gate 120 distinguishes a channel region of the FET from source and drain regions of the FET. Namely, a portion of nanowire 118 below gate 120 will form the channel region of the FET. Portions of nanowire 118 extending out from gate 120, as well as sections of SOI layer 112 to either side of gate 120, will form source/drain regions of the FET (the particular side of the gate on which the source (or drain) region is formed is inconsequential, as long as the source region is present on one side of the gate and the drain region is present on another side of the gate opposite the source region).

Further, the portion of the nanowire that forms the channel region can have a diameter that is smaller than a diameter of the portions of the nanowire that extend out from the gate (i.e., that are outside of the channel region). By way of example only, the portion of the nanowire that forms the channel region can have a diameter of between about one nm and about 10 nm, e.g., between about one nm and about five nm.

Gate 120 is separated from nanowire 118 by gate dielectric layer 126. According to an exemplary embodiment, gate dielectric layer 126 comprises an oxide. It is to be understood, however, that gate dielectric layer 126 can comprise any suitable gate dielectric material including, but not limited to, one or more of a solid dielectric material such as an oxide, a nitride, an oxynitride, a high-k dielectric material and layered combinations thereof, an air gap dielectric wherein the term "air" is intended to denote gasses, such as nitrogen, oxygen, hydrogen, helium, argon, vacuum and mixtures thereof, or a combination of solid and air gap dielectrics.

Insulator 128 divides SOI layer 112 into two electrically isolated sections, one section corresponding to, i.e., that is included in, the source region and the other section corresponding to, i.e., that is included in, the drain region. Insulator 128 and a center portion of gate dielectric layer 126 are typically connected so as to leave the entire circumference of nanowire 118 surrounded by dielectric in the nanowire channel region. According to an exemplary embodiment, insulator 128 comprises an oxide. It is to be understood, however, that insulator 128 can comprise any suitable insulating material including, but not limited to, one or more of a solid dielectric material such as an oxide, a nitride, an oxynitride, a high-k dielectric material and layered combinations thereof, an air gap dielectric wherein the term "air" is intended to denote gasses, such as nitrogen, oxygen, hydrogen, helium, argon, vacuum and mixtures thereof, or a combination of solid and air gap dielectrics.

Epitaxial semiconductor material 130 is present over the portions of nanowire 118 extending out from gate 120 and over SOI layer 112. According to an exemplary embodiment, epitaxial semiconductor material 130 is a single crystal material comprising one or more of Si and silicon germanium (SiGe). In one exemplary embodiment, epitaxial semiconductor material 130 comprises at least one chemical element that is different from nanowire 118. By way of example only, nanowire 118 can comprise Si, while epitaxial semiconductor material 130 can comprise SiGe. This elemental difference can be used during fabrication to distinguish between the structures (see below). As will be described in detail below, epitaxial semiconductor material 130 can be grown from SOI layer 112, i.e., using SOI layer 112 as a template. As such, epitaxial semiconductor material 130 can have a common crystal structure with SOI layer 112. Epitaxial semiconductor material 130 forms a unified source region and a unified drain region. Namely, epitaxial semiconductor material 130 attaches (and thereby both physically and electrically connects) the portions of nanowire 118 that extend out from gate 120 with the source/drain sections of SOI layer 112, thus merging the portions of nanowire 118 that extend out from gate 120 with the source/drain sections of SOI layer 112 to form merged source and drain regions.

Spacers 122 are present adjacent to gate 120. According to an exemplary embodiment, spacers 122 comprise one or more of an insulating nitride, an oxide, an oxynitride or multilayers thereof.

Metal-semiconductor alloy layers 124 are present over epitaxial semiconductor material 130. According to an exemplary embodiment, metal-semiconductor alloy layers 124 comprise Si, e.g., a silicide, or Ge with one or more of nickel (Ni), cobalt (Co) and titanium (Ti). Metal-semiconductor alloy layers 124 may also be present over gate 120, e.g., when gate 120 comprises poly-Si (as described above).

An exemplary method for fabricating FET 102 is provided below. Specifically, methodology 700 described in conjunction with the description of FIG. 7, below, can be used to fabricate FET 102.

Figure 2:
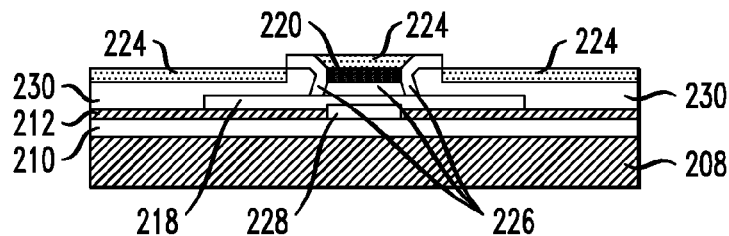
FIG. 2 is a diagram illustrating another exemplary FET having a nanowire channel according to an embodiment of the present invention.

FIG. 2 is a diagram illustrating exemplary FET 202 having a nanowire channel. For ease of depiction, the structures shown illustrated in FIG. 2 are not drawn to scale. Further, the cross-sectional view shown in FIG. 2 depicts a FET having a single nanowire channel. It is to be understood, however, that FET 202 may comprise multiple nanowire channels.

Namely, FET 202 comprises semiconductor substrate 208 having BOX layer 210 and SOI layer 212 over BOX layer 210. According to an exemplary embodiment, substrate 208 comprises Si. Optionally, substrate 208 can be doped if backgating of the nanowire channel is desired. BOX layer 210 can have a thickness of between about five nm and about 200 nm. A thinner BOX layer may be used, for example, when the nanowire channel is back-gated. SOI layer 212 can have a thickness of between about five nm and about 10 nm.

Nanowire 218 is present over SOI layer 212. According to an exemplary embodiment, nanowire 218 comprises a highly anisotropic semiconductor crystal, such as a highly anisotropic Si crystal. It is to be understood, however, that nanowire 218 can comprise any highly anisotropic semiconductor crystal, including, but not limited to, one or more of Si, Ge and III-V semiconductors.

Gate 220 is present over nanowire 218. Gate 220 can comprise any suitable gate conductor material, including, but not limited to, one or more of doped poly-Si, a metal, a metal alloy and a metal-semiconductor alloy. As above, gate 220 distinguishes a channel region of the FET from a source region and a drain region of the FET. Namely, a portion of nanowire 218 below gate 220 will form the channel region of the FET. Portions of nanowire 218 extending out from gate 220, as well as sections of SOI layer 212 to either side of gate 220, will form source/drain regions of the FET.

Further, the portion of the nanowire that forms the channel region can have a diameter that is smaller than a diameter of the portions of the nanowire that extend out from the gate (i.e., outside of the channel region). By way of example only, the portion of the nanowire that forms the channel region can have a diameter of between about one nm and about 10 nm, e.g., between about one nm and about five nm.

By way of comparison with gate 120, described in conjunction with the description of FIG. 1, above, gate 220 does not overlap the source and drain regions. Namely, gate 220 is in exact line with the source and drain regions. This configuration is beneficial for a number of reasons. First, this nonoverlap configuration minimizes, or eliminates, a gate-to-source and a gate-to-drain overlap capacitance. Second, since the gate does not extend up above the dielectric layer (described below), spacers are not needed around the gate.

Gate 220 is separated from nanowire 218 by gate dielectric layer 226. According to an exemplary embodiment, gate dielectric layer 226 comprises an oxide. It is to be understood, however, that gate dielectric layer 226 can comprise any suitable gate dielectric material including, but not limited to, one or more of a solid dielectric material such as an oxide, a nitride, an oxynitride, a high-k dielectric material and layered combinations thereof, an air gap dielectric wherein the term "air" is intended to denote gasses, such as nitrogen, oxygen, hydrogen, helium, argon, vacuum and mixtures thereof, or a combination of solid and air gap dielectrics.

Insulator 228 divides SOI layer 212 into two electrically isolated sections, one section corresponding to, i.e., that is included in, the source region and the other section corresponding to, i.e., that is included in, the drain region. According to an exemplary embodiment, insulator 228 comprises an oxide.

Epitaxial semiconductor material 230 is present over the portions of nanowire 218 extending out from gate 220 and over SOI layer 212. As above, epitaxial semiconductor material 230 can be a single crystal material comprising one or more of Si and SiGe and may comprise at least one element that is different from nanowire 218. By way of example only, nanowire 218 can comprise Si, while epitaxial semiconductor material 230 can comprise SiGe. This elemental difference can be used during fabrication to distinguish between the structures (see below). Epitaxial semiconductor material 230 forms a unified source region and a unified drain region. Namely, epitaxial semiconductor material 230 attaches (and thereby both physically and electrically connects) the portions of nanowire 218 that extend out from gate 220 with the source/drain sections of SOI layer 212, thus merging the portions of nanowire 218 that extend out from gate 220 with the source/drain sections of SOI layer 212 to form merged source and drain regions.

Metal-semiconductor alloy layers 224 are present over epitaxial semiconductor material 230. According to an exemplary embodiment, metal-semiconductor alloy layers 224 comprise Si, e.g., a silicide, or Ge with one or more of Ni, Co and Ti. Metal-semiconductor alloy layers 224 may also be present over gate 220, e.g., when gate 220 comprises poly-Si (as described above).

An exemplary method for fabricating FET 202 is provided below. Specifically, methodology 700 described in conjunction with the description of FIG. 7, below, can be used to fabricate FET 202.

Figure 3:
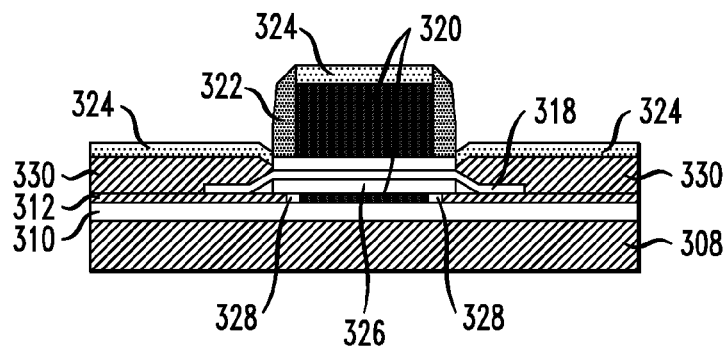
FIG. 3 is a diagram illustrating yet another exemplary FET having a nanowire channel according to an embodiment of the present invention.

FIG. 3 is a diagram illustrating exemplary FET 302 having a nanowire channel. For ease of depiction, the structures shown illustrated in FIG. 3 are not drawn to scale. Further, the cross-sectional view shown in FIG. 3 depicts a FET having a single nanowire channel. It is to be understood, however, that FET 302 may comprise multiple nanowire channels.

Namely, FET 302 comprises semiconductor substrate 308 having BOX layer 310 and SOI layer 312 over BOX layer 310. According to an exemplary embodiment, substrate 308 comprises Si. BOX layer 310 can have a thickness of between about five nm and about 200 nm. A thinner BOX layer may be used, for example, when the nanowire channel is back-gated. SOI layer 312 can have a thickness of between about five nm and about 10 nm.

Nanowire 318 is present over SOI layer 312. According to an exemplary embodiment, nanowire 318 comprises a highly anisotropic semiconductor crystal, such as a highly anisotropic Si crystal. It is to be understood, however, that nanowire 318 can comprise any highly anisotropic semiconductor crystal, including, but not limited to, one or more of Si, Ge and III-V semiconductors.

Gate 320 surrounds nanowire 318. Gate 320 can comprise any suitable gate conductor material, including, but not limited to, one or more of doped poly-Si, a metal, a metal alloy and a metal-semiconductor alloy. As above, gate 320 distinguishes a channel region of the FET from a source region and a drain region of the FET. Namely, a portion of nanowire 318 within gate 320 will form the channel region of the FET. Portions of nanowire 318 extending out from gate 320, as well as sections of SOI layer 312 to either side of gate 320, will form source/drain regions of the FET.

Gate 320 is separated from nanowire 318 by gate dielectric layer 326. According to an exemplary embodiment, gate dielectric layer 326 comprises an oxide. It is to be understood, however, that gate dielectric layer 326 can comprise any suitable gate dielectric material including, but not limited to, one or more of a solid dielectric material such as an oxide, a nitride, an oxynitride, a high-k dielectric material and layered combinations thereof, an air gap dielectric wherein the term "air" is intended to denote gasses, such as nitrogen, oxygen, hydrogen, helium, argon, vacuum and mixtures thereof, or a combination of solid and air gap dielectrics. Since gate 320 surrounds nanowire 318, gate dielectric layer 326 must also surround nanowire 318. Therefore, the presence of gate dielectric layer 326 under nanowire 318 causes the portions of nanowire 318 extending out from gate 320 to bend downward to contact SOI layer 312. Insulating gap 328 divides SOI layer 312 into two electrically isolated sections, one section corresponding to, i.e., that is included in, the source region and the other section corresponding to, i.e., that is included in, the drain region.

Epitaxial semiconductor material 330 is present over the portions of nanowire 318 extending out from gate 320 and over SOI layer 312. As above, epitaxial semiconductor material 330 can be a single crystal material comprising one or more of Si and SiGe and may comprise at least one element that is different from nanowire 318. By way of example only, nanowire 318 can comprise Si, while epitaxial semiconductor material 330 can comprise SiGe. This elemental difference can be used during fabrication to distinguish between the structures (see below). Epitaxial semiconductor material 330 forms a unified source region and a unified drain region. Namely, epitaxial semiconductor material 330 attaches (and thereby both physically and electrically connects) the portions of nanowire 318 that extend out from gate 320 with the source/drain sections of SOI layer 312, thus merging the portions of nanowire 318 that extend out from gate 320 with the source/drain sections of SOI layer 312 to form merged source and drain regions.

Spacers 322 are present adjacent to gate 320. According to an exemplary embodiment, spacers 322 comprise one or more of an insulating nitride, an oxide, an oxynitride or multilayers thereof.

Metal-semiconductor alloy layers 324 are present over epitaxial semiconductor material 330. According to an exemplary embodiment, metal-semiconductor alloy layers 324 comprise Si, e.g., a silicide, or Ge with one or more of Ni, Co and Ti. Metal-semiconductor alloy layers 324 may also be present over gate 320, e.g., when gate 320 comprises poly-Si (as described above).

An exemplary method for fabricating FET 302 is provided below. Specifically, methodology 800 described, for example, in conjunction with the description of FIG. 8, below, can be used to fabricate FET 302.

Figure 4:
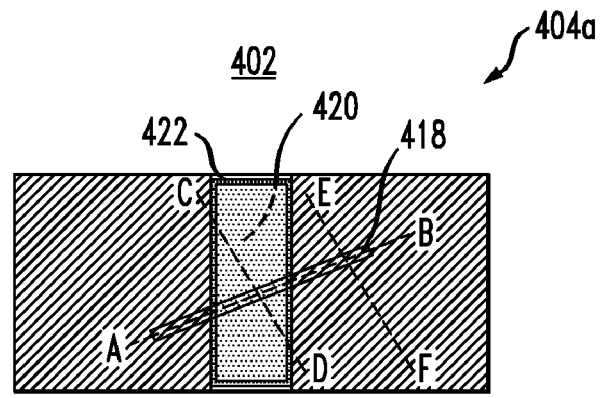
FIG. 4 is a diagram illustrating still another exemplary FET having a nanowire channel according to an embodiment of the present invention.
Figure 4:
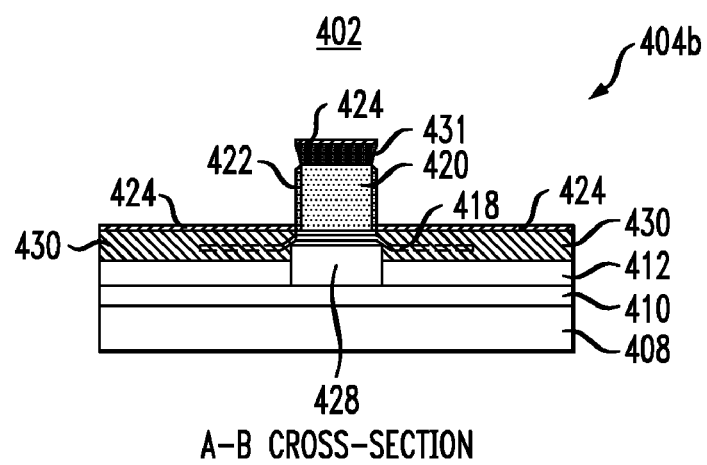
Figure 4:
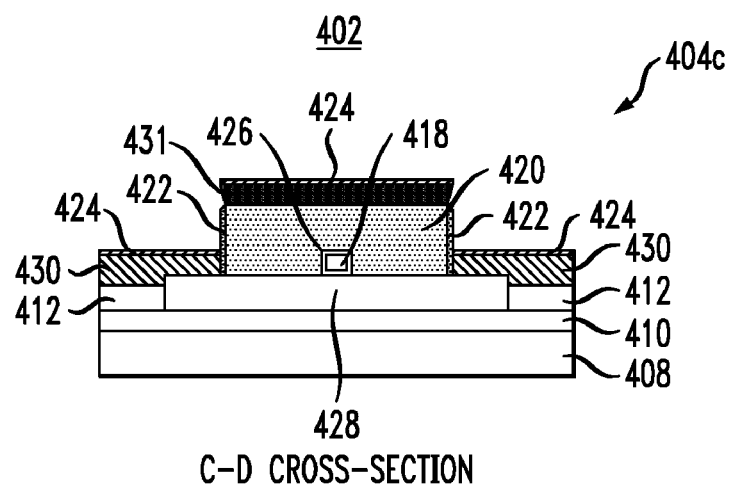

FIG. 4 is a diagram illustrating exemplary FET 402 having a nanowire channel. For ease of depiction, the structures shown illustrated in FIG. 4 are not drawn to scale. Further, the views shown in FIG. 4 depict a FET having a single nanowire channel. It is to be understood, however, that FET 402 may comprise multiple nanowire channels.

For illustrative purposes, FIG. 4 includes several views of FET 402, namely a top-down view 404a, a cross-sectional view 404b through plane A-B and a cross-sectional view 404c through plane C-D. FET 402 comprises semiconductor substrate 408 having BOX layer 410 and SOI layer 412 over BOX layer 410. According to an exemplary embodiment, substrate 408 comprises Si. Optionally, substrate 408 can be doped if back-gating of the nanowire channel is desired. BOX layer 410 can have a thickness of between about five nm and about 200 nm. A thinner BOX layer may be used, for example, when the nanowire channel is back-gated. SOI layer 412 can have a thickness of between about five nm and about 10 nm.

Nanowire 418 is present over SOI layer 412. According to an exemplary embodiment, nanowire 418 comprises a highly anisotropic semiconductor crystal, such as a highly anisotropic Si crystal. It is to be understood, however, that nanowire 418 can comprise any highly anisotropic semiconductor crystal, including, but not limited to, one or more of Si, Ge and III-V semiconductors.

Gate 420 is present over nanowire 418. Gate 420 can comprise any suitable gate conductor material, including, but not limited to, one or more of doped poly-Si, a metal, a metal alloy and a metal-semiconductor alloy. As above, gate 420 distinguishes a channel region of the FET from a source region and a drain region of the FET. Namely, a portion of nanowire 418 below gate 420 will form the channel region of the FET. Portions of nanowire 418 extending out from gate 420, as well as sections of SOI layer 412 to either side of gate 420, will form source/drain regions of the FET.

Gate 420 is separated from nanowire 418 by gate dielectric layer 426. According to an exemplary embodiment, gate dielectric layer 426 comprises an oxide. It is to be understood, however, that gate dielectric layer 426 can comprise any suitable gate dielectric material including, but not limited to, one or more of a solid dielectric material such as an oxide, a nitride, an oxynitride, a high-k dielectric material and layered combinations thereof, an air gap dielectric wherein the term "air" is intended to denote gasses, such as nitrogen, oxygen, hydrogen, helium, argon, vacuum and mixtures thereof, or a combination of solid and air gap dielectrics.

Shallow trench isolation (STI) region 428 divides SOI layer 412 into two electrically isolated sections, one section corresponding to, i.e., that is included in, the source region and the other section corresponding to, i.e., that is included in, the drain region. By way of example only, STI region 428 can comprise one or more of an insulating nitride, an oxide, an oxynitride and multilayers thereof. Since STI region 428 is thicker than SOI layer 412, the presence of STI region 428 under nanowire 418 causes nanowire 418 to be raised from the surface of SOI layer 412 in the channel region. This configuration, however, is merely exemplary. Namely, STI region 428 can be the same thickness as, or thinner than SOI layer 412 (resulting in nanowire 418 being flat on the surface of SOI layer 412 or sunken into SOI layer 412 in the channel region, respectively), without changing the performance of the device.

Epitaxial semiconductor material 430 is present over the portions of nanowire 418 extending out from gate 420 and over SOI layer 412. As above, epitaxial semiconductor material 430 can be a single crystal material comprising one or more of Si and SiGe and comprise at least one element that is different from nanowire 418. By way of example only, nanowire 418 can comprise Si, while epitaxial semiconductor material 430 can comprise SiGe. This elemental difference can be used during fabrication to distinguish between the materials of each structure (see below). Epitaxial semiconductor material 430 forms a unified source region and a unified drain region. Namely, epitaxial semiconductor material 430 attaches (and thereby both physically and electrically connects) the portions of nanowire 418 that extend out from gate 420 with the source/drain sections of SOI layer 412, thus merging the portions of nanowire 418 that extend out from gate 420 with the source/drain sections of SOI layer 412 to form merged source and drain regions. Epitaxial semiconductor material 431 is present over gate 420, for example, if gate 420 was not capped by an insulator during epitaxy. In many variants of FET 402, epitaxial semiconductor material 431 is not present.

In FET 402, the epitaxial semiconductor material, the SOI layer and portions of the nanowire within the source and drain regions (i.e., portions of the nanowire that extend out from the gate) all have a common crystal structure. Namely, recrystallization in the epitaxial semiconductor material, in the portions of the nanowire within the source and drain regions (i.e., outside of the channel region) and in portions of the SOI layer (represented with the same hatched pattern in FIG. 4) unifies the crystal structure of these regions. Recrystallization to form a unified crystal structure will be described in detail below.

Spacers 422 are present adjacent to all sides of gate 420. According to an exemplary embodiment, spacers 422 comprise one or more of an insulating nitride, an oxide, an oxynitride or multilayers thereof.

Metal-semiconductor alloy layers 424 are present over epitaxial semiconductor material 430/431. According to an exemplary embodiment, metal-semiconductor alloy layers 424 comprise Si, e.g., a silicide, or Ge with one or more of Ni, Co and Ti.

An exemplary method for fabricating FET 402 is provided below. Specifically, methodology 900 described in conjunction with the description of FIG. 9, below, can be used to fabricate FET 402.

Figure 5:
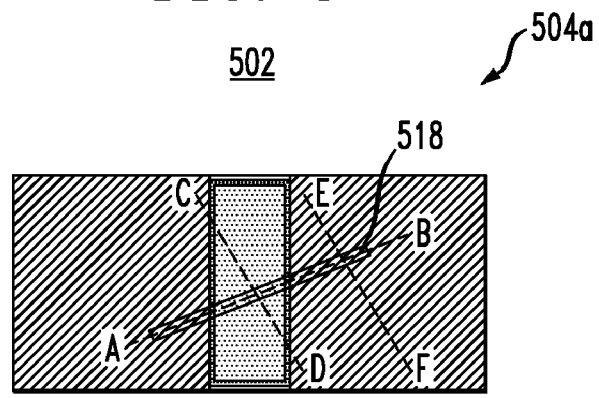
FIG. 5 is a diagram illustrating still yet another exemplary FET having a nanowire channel according to an embodiment of the present invention.
Figure 5:
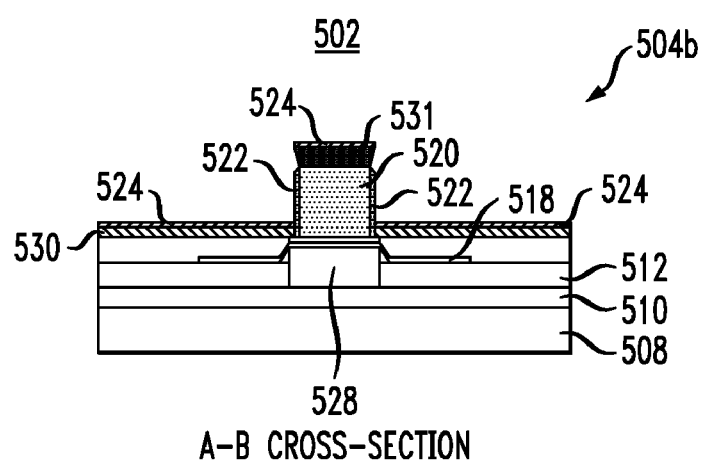
Figure 5:
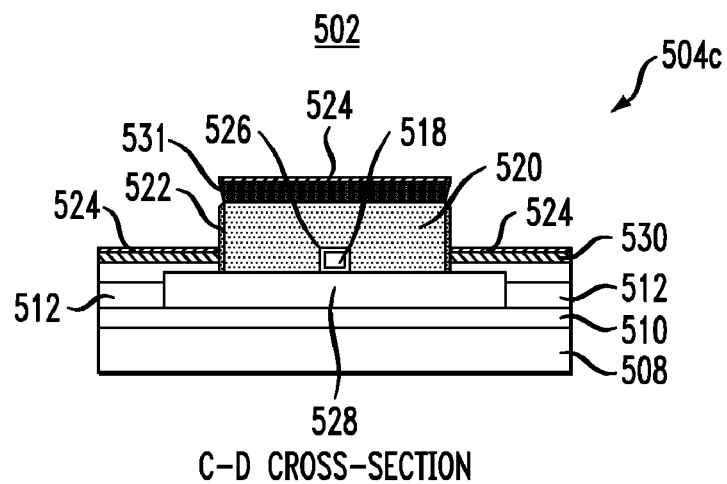

FIG. 5 is a diagram illustrating exemplary FET 502 having a nanowire channel. For ease of depiction, the structures shown illustrated in FIG. 5 are not drawn to scale. Further, the views shown in FIG. 5 depict a FET having a single nanowire channel. It is to be understood, however, that FET 502 may comprise multiple nanowire channels.

For illustrative purposes, FIG. 5 includes several views of FET 502, namely a top-down view 504a, a cross-sectional view 504b through plane A-B and a cross-sectional view 504c through plane C-D. FET 502 comprises semiconductor substrate 508 having BOX layer 510 and SOI layer 512 over BOX layer 510. According to an exemplary embodiment, substrate 508 comprises Si. Optionally, substrate 508 can be doped if back-gating of the nanowire channel is desired. BOX layer 510 can have a thickness of between about five nm and about 200 nm. A thinner BOX layer may be used, for example, when the nanowire channel is back-gated. SOI layer 512 can have a thickness of between about five nm and about 10 nm.

Nanowire 518 is present over SOI layer 512. According to an exemplary embodiment, nanowire 518 comprises a highly anisotropic semiconductor crystal, such as a highly anisotropic Si crystal. It is to be understood, however, that nanowire 518 can comprise any highly anisotropic semiconductor crystal, including, but not limited to, one or more of Si, Ge and III-V semiconductors.

Gate 520 is present over nanowire 518. Gate 520 can comprise any suitable gate conductor material, including, but not limited to, one or more of doped poly-Si, a metal, a metal alloy and a metal-semiconductor alloy. Gate 520 distinguishes a channel region of the FET from a source region and a drain region of the FET. Namely, a portion of nanowire 518 below gate 520 will form the channel region of the FET.

Portions of nanowire 518 extending out from gate 520, as well as sections of SOI layer 512 to either side of gate 520, will form source/drain regions of the FET.

Gate 520 is separated from nanowire 518 by gate dielectric layer 526. According to an exemplary embodiment, gate dielectric layer 526 comprises an oxide. It is to be understood, however, that gate dielectric layer 526 can comprise any suitable gate dielectric material including, but not limited to, one or more of a solid dielectric material such as an oxide, a nitride, an oxynitride, a high-k dielectric material and layered combinations thereof, an air gap dielectric wherein the term "air" is intended to denote gasses, such as nitrogen, oxygen, hydrogen, helium, argon, vacuum and mixtures thereof, or a combination of solid and air gap dielectrics. STI region 528 divides SOI layer 512 into two electrically isolated sections, one section corresponding to, i.e., that is included in, the source region and the other section corresponding to, i.e., that is included in, the drain region. By way of example only, STI region 528 can comprise one or more of an insulating nitride, an oxide, an oxynitride and multilayers thereof. Since STI region 528 is thicker than SOI layer 512, the presence of STI region 528 under nanowire 518 causes nanowire 518 to be raised from the surface of SOI layer 512 in the channel region. This configuration, however, is merely exemplary. Namely, STI region 528 can be the same thickness as, or thinner than SOI layer 512 (resulting in nanowire 518 being flat on the surface of SOI layer 512 or sunken into SOI layer 512 in the channel region, respectively), without changing the performance of the device.

Epitaxial semiconductor material 530 is present over the portions of nanowire 518 extending out from gate 520 and over SOI layer 512. As above, epitaxial semiconductor material 530 is a single crystal material comprising one or more of Si and SiGe and may comprise at least one element that is different from nanowire 518. By way of example only, nanowire 518 can comprise Si, while epitaxial semiconductor material 530 can comprise SiGe. This elemental difference can be used during fabrication to distinguish between the structures (see below). Epitaxial semiconductor material 530 forms a unified source region and a unified drain region. Namely, epitaxial semiconductor material 530 attaches (and thereby both physically and electrically connects) the portions of nanowire 518 that extend out from gate 520 with the source/drain sections of SOI layer 512, thus merging the portions of nanowire 518 that extend out from gate 520 with the source/drain sections of SOI layer 512 to form merged source and drain regions.

Epitaxial semiconductor material 531 is present over gate 520, for example, if gate 520 was not capped by an insulator during epitaxy. In many variants of FET 502, epitaxial semiconductor material 531 is not present.

In FET 502, the epitaxial semiconductor material has a common crystal structure. Namely, recrystallization in a portion of the epitaxial semiconductor material (represented with the same hatched pattern in FIG. 5) unifies the crystal structure of the epitaxial semiconductor material. Recrystallization to form a unified crystal structure will be described in detail below.

Spacers 522 are present adjacent to all sides of gate 520. According to an exemplary embodiment, spacers 522 comprise one or more of an insulating nitride, an oxide, an oxynitride or multilayers thereof.

Metal-semiconductor alloy layers 524 are present over epitaxial semiconductor material 530/531. According to an exemplary embodiment, metal-semiconductor alloy layers 524 comprise Si, e.g., a silicide, or Ge with one or more of Ni, Co and Ti.

An exemplary method for fabricating FET 502 is provided below. Specifically, methodology 900 described in conjunction with the description of FIG. 9, below, can be used to fabricate FET 502.

Figure 6:
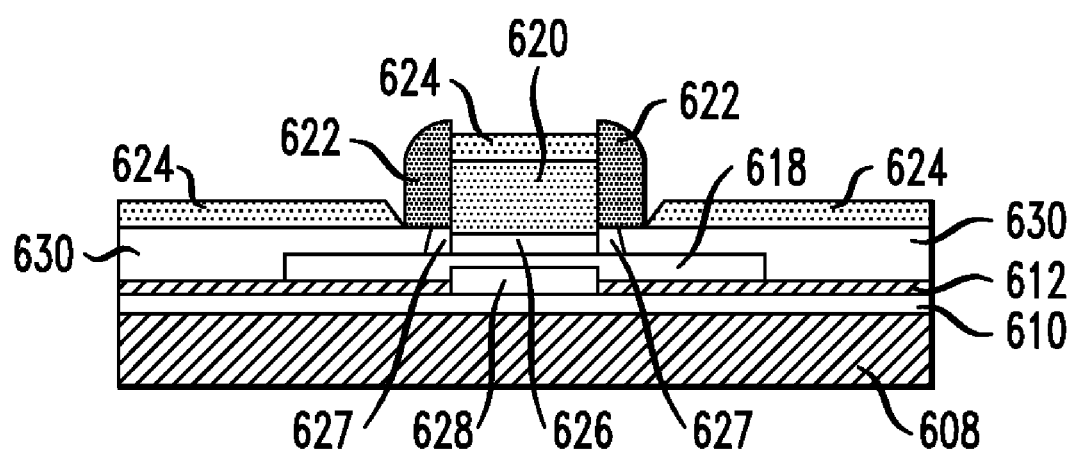
FIG. 6 is a diagram illustrating a further exemplary FET having a nanowire channel according to an embodiment of the present invention.

FIG. 6 is a diagram illustrating exemplary FET 602 having a nanowire channel. For ease of depiction, the structures shown illustrated in FIG. 6 are not drawn to scale. Further, the cross-sectional view shown in FIG. 6 depicts a FET having a single nanowire channel. It is to be understood, however, that FET 602 may comprise multiple nanowire channels.

Namely, FET 602 comprises semiconductor substrate 608 having BOX layer 610 and SOI layer 612 over BOX layer 610. According to an exemplary embodiment, substrate 608 comprises Si. Optionally, substrate 608 can be doped if back-gating of the nanowire channel is desired. BOX layer 610 can have a thickness of between about five nm and about 200 nm. A thinner BOX layer may be used, for example, when the nanowire channel is back-gated. SOI layer 612 can have a thickness of between about five nm and about 10 nm.

Nanowire 618 is present over SOI layer 612. According to an exemplary embodiment, nanowire 618 comprises a highly anisotropic semiconductor crystal, such as a highly anisotropic Si crystal. It is to be understood, however, that nanowire 618 can comprise any highly anisotropic semiconductor crystal, including, but not limited to, one or more of Si, Ge and III-V semiconductors.

Gate 620 is present over nanowire 618. Gate 620 can comprise any suitable gate conductor material, including, but not limited to, one or more of doped poly-Si, a metal, a metal alloy and a metal-semiconductor alloy. Gate 620 distinguishes a channel region of the FET from a source region and a drain region of the FET. Namely, a portion of nanowire 618 below gate 620 will form the channel region of the FET. Portions of nanowire 618 extending out from gate 620, as well as sections of SOI layer 612 to either side of gate 620, will form source/drain regions of the FET.

Gate 620 is separated from nanowire 618 by gate dielectric layer 626. According to an exemplary embodiment, gate dielectric layer 626 comprises an oxide. It is to be understood, however, that gate dielectric layer 626 can comprise any suitable gate dielectric material including, but not limited to, one or more of a solid dielectric material such as an oxide, a nitride, an oxynitride, a high-k dielectric material and layered combinations thereof, an air gap dielectric wherein the term "air" is intended to denote gasses, such as nitrogen, oxygen, hydrogen, helium, argon, vacuum and mixtures thereof, or a combination of solid and air gap dielectrics.

Insulator 628 divides SOI layer 612 into two electrically isolated sections, one section corresponding to, i.e., that is included in, the source region and the other section corresponding to, i.e., that is included in, the drain region. According to an exemplary embodiment, insulator 628 comprises an oxide. It is to be understood, however, that gate dielectric layer 626 can comprise any suitable gate dielectric material including, but not limited to, one or more of a solid dielectric material such as an oxide, a nitride, an oxynitride, a high-k dielectric material and layered combinations thereof, an air gap dielectric wherein the term "air" is intended to denote gasses, such as nitrogen, oxygen, hydrogen, helium, argon, vacuum and mixtures thereof, or a combination of solid and air gap dielectrics.

Epitaxial semiconductor material 630 is present over the portions of nanowire 618 extending out from gate 620 and over SOI layer 612. As above, epitaxial semiconductor material 630 can be a single crystal material comprising one or more of Si and SiGe and may comprise at least one element that is different from nanowire 618. By way of example only, nanowire 618 can comprise Si, while epitaxial semiconductor material 630 can comprise SiGe. This elemental difference can be used during fabrication to distinguish between the structures (see below). Epitaxial semiconductor material 630 forms a unified source region and a unified drain region. Namely, epitaxial semiconductor material 630 attaches (and thereby both physically and electrically connects) the portions of nanowire 618 that extend out from gate 620 with the source/drain sections of SOI layer 612, thus merging the portions of nanowire 618 that extend out from gate 620 with the source/drain sections of SOI layer 612 to form merged source and drain regions.

Spacers 622 and 627 are present adjacent to gate 620. According to an exemplary embodiment, spacers 622 comprise one or more of an insulating nitride, an oxide, an oxynitride or multilayers thereof and spacers 627 comprise an oxide, such as silicon dioxide ($SiO_2$).

Metal-semiconductor alloy layers 624 are present over epitaxial semiconductor material 630. According to an exemplary embodiment, metal-semiconductor alloy layers 624 comprise Si, e.g., a silicide, or Ge with one or more of Ni, Co and Ti. Metal-semiconductor alloy layers 624 may also be present over gate 620, e.g., when gate 620 comprises poly-Si (as described above).

An exemplary method for fabricating FET 602 is provided below. Specifically, methodology 1000 described in conjunction with the description of FIG. 10, below, can be used to fabricate FET 602.

Figure 7:
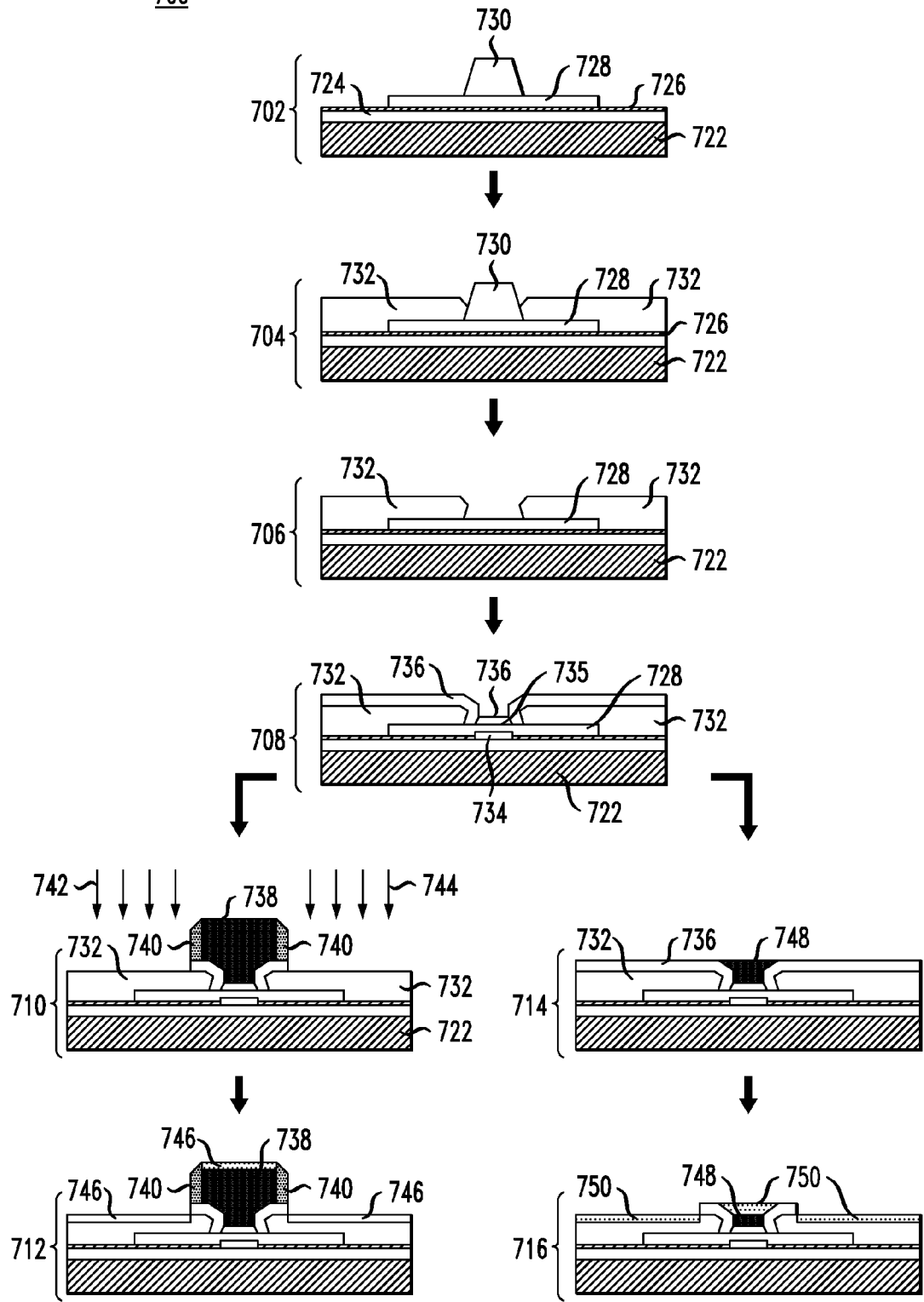
FIG. 7 is a diagram illustrating an exemplary methodology for fabricating a FET having a nanowire channel according to an embodiment of the present invention.

FIG. 7 is a diagram illustrating exemplary methodology 700 for fabricating a FET having a nanowire channel. As will be apparent from the following description, methodology 700 involves forming a gate after a source and drain region of the FET are fabricated.

For ease of depiction, the structures shown illustrated in FIG. 7 are not drawn to scale. Further, the cross-sectional views shown in FIG. 7 depict the fabrication of a single FET having a single nanowire channel. It is to be understood, however, that the FET may comprise multiple nanowire channels fabricated according to the techniques presented herein. For example, multiple nanowire channels may be used in applications requiring a higher current drive. Further, multiple FETs, each FET having at least one nanowire channel, may be fabricated on a common wafer according to the techniques presented herein.

The following description will be based on the use of Si nanowires and Si processing. However, it is to be understood that the present teachings are applicable to the use of other semiconductor materials, such as Ge or III-V semiconductors (with, for example, growth temperature and dopant species adapted to the specific semiconductor material used).

In step 702, a substrate 722 is provided. Substrate 722 comprises BOX layer 724 and SOI layer 726 over BOX layer 724.

According to an exemplary embodiment, substrate 722 comprises Si (as described above) and can optionally be doped if back-gating of the nanowire channel is desired. Namely, according to an exemplary embodiment (not shown), substrate 722 is conductive and serves as a gate conductor. SOI layer 726 can be formed over BOX layer 724 using conventional oxygen implantation (e.g., SIMOX-SOI implantation technology, Ibis Technology Corporation, Danvers, Mass.) or wafer bonding processes (e.g., Smart Cut™, S.O.I.TEC, S.A., Grenoble, France).

An undoped semiconductor nanowire, i.e., nanowire 728, is deposited over SOI layer 726. For ease of depiction, a single nanowire 728 is shown. However, when multiple FETs are being formed, multiple nanowires would be deposited over SOI layer 726. The term "undoped," as used herein, generally refers to the nanowire not being intentionally doped. Namely, a certain amount of dopants, e.g., less than about 5E17 $cm^{-3}$ may unintentionally get incorporated in the nanowire during the fabrication process. Such a nanowire would still be considered herein as "undoped."

The following description is based on nanowire 728 comprising a highly anisotropic semiconductor crystal, such as a highly anisotropic Si crystal. According to an exemplary embodiment, nanowire 728 comprises a highly anisotropic semiconductor crystal, such as a highly anisotropic Si crystal. It is to be understood, however, that nanowire 728 can comprise any highly anisotropic semiconductor crystal, including, but not limited to, one or more of Si, Ge and III-V semiconductors. As described below, the anisotropy of a nanowire is reflected by its external structure, i.e., morphology. Namely, nanowire 728 comprises a single filamentary crystal with a very high aspect ratio (e.g., greater than about 10) of length L to diameter d. For example, according to one embodiment, nanowire 728 has a length L of between about 0.1 micrometers (μm) and about 30 μm, and a diameter d of between about three nm and about 100 nm, e.g., between about 10 nm and about 30 nm. These nanowire dimensions provided are merely exemplary, and are meant to represent the nanowire "as-grown" dimensions (see below). As described throughout the instant description, processes are undertaken that change/alter the nanowire dimensions. For example, as will be described in detail below, the nanowire can be thinned in the channel region.

Semiconductor nanowires, such as nanowire 728, can be synthesized by catalytic growth carried out in a growth chamber, e.g., a chemical vapor deposition (CVD) or plasma enhanced chemical vapor deposition (PECVD) chamber, at a particular temperature and pressure. The growth temperature depends on the semiconductor and the precursor used. By way of example only, Si nanowires can be grown at a temperature of between about 370 degrees Celsius (° C.) and about 500° C. when silane ($SiH_4$) is used as a precursor. The growth temperature can be altered by adding elements, such as chlorine ($Cl_2$) or hydrogen ($H_2$), to the $SiH_4$. For example, by adding $Cl_2$ to the $SiH_4$ the growth temperature can be raised to above about 600° C. With the use of silicon-tetrachloride ($SiCl_4$) as a precursor, the growth temperature is even higher, i.e., between about 800° C. and about 950° C.

A rate of growth of the nanowires during synthesis depends on the growth temperature and the gas pressure in the growth chamber. By way of example only, for the synthesis of Si nanowires using $SiH_4$ diluted with $H_2$ (1:1) as a precursor, at a pressure of one Torr and a growth temperature of about 450° C., the CVD growth rate would be about 7.6 micrometers per hour (μm/hour).

The anisotropic growth of nanowires can be achieved using a vapor-liquid-solid (VLS) growth process. For a general description of the VLS growth process, see E.I. GIVARGIZOV, HIGHLY ANISOTROPIC CRYSTALS, pp. 93-97 (1987), the contents of which are incorporated by reference herein. In general, the VLS growth process involves incorporating material from a vapor into the nanowire via a liquid catalyst.

By way of example only, the VLS process for forming Si nanowires on a substrate can be performed as follows. When growth is initiated, a metallic catalyst-Si alloy droplet is formed. A suitable VLS metallic catalyst is, for example, gold (Au). With additional Si supplied from the gas phase, e.g., from $SiH_4$, the droplet becomes supersaturated with Si (with excess Si being deposited at the droplet-substrate interface). As a result, Si precipitates out from the droplet as a crystalline nanowire on the substrate, and the droplet is raised from the substrate surface as a growing tip. If the growth temperature is kept below a decomposition temperature of the Si precursor (e.g., below about 500° C. if $SiH_4$ is used as the precursor), no additional deposition of Si take places on the nanowire sidewalls (i.e., no radial growth). Thus, the only growth taking place is that enabled by the metallic catalyst which leads to anisotropic growth.

Sacrificial gate 730 is then formed over nanowire 728. According to an exemplary embodiment, sacrificial gate 730 is formed by first blanket depositing a dielectric material, such as a low-temperature oxide (LTO), over nanowire 728 using, e.g., CVD. The LTO is then patterned and etched to form sacrificial gate 730 over nanowire 728/SOI layer 726. As described above, the present teachings may be used to form multiple FETs on a common wafer and/or FETs having multiple nanowire channels. In that instance, sacrificial gate 730 can be formed as a sacrificial gate line through the multiple FETs and/or multiple nanowire channels.

Sacrificial gate 730 distinguishes a channel region of the FET from a source region and a drain region of the FET. Namely, a portion of nanowire 728 below sacrificial gate 730 will form the channel region of the FET. Portions of nanowire 728 extending out from sacrificial gate 730, as well as sections of SOI layer 726 to either side of sacrificial gate 730, will form source/drain regions of the FET.

In step 704, a single-crystal semiconductor material 732 is epitaxially and selectively grown from SOI layer 726, i.e., single-crystal semiconductor material 732 is grown on SOI layer 726 and SOI layer 726 serves as a template for the growth. According to an exemplary embodiment, nanowire 728 comprises Si and the single-crystal deposited material comprises either Si or SiGe. Thus, the single-crystal deposited material can comprise at least one chemical element that is different from the nanowire channel, e.g., Si nanowire and SiGe deposited material. This elemental difference between the nanowire and the deposited material can be beneficial in certain circumstances. For example, if the nanowire has an arbitrary crystal orientation, amorphization and recrystallization can be used to unify the crystal structure of the nanowire and the deposited material. Then, if desired, the deposited material can be selectively removed from the nanowire based on their elemental differences. Amorphization and recrystallization will be described in detail below. Further, SiGe has a lower resistivity than Si and for that reason SiGe may be selected for use as the deposited material.

Further, as will be described below, growth parameters can be selected to attain selective growth of epitaxial semiconductor material 732 only over semiconductor surfaces, i.e., surfaces of SOI layer 726/nanowire 728, and not over oxide (sacrificial gate 730) or nitride surfaces. Growth will not occur on surfaces of SOI layer 726/nanowire 728 covered by sacrificial gate 730.

It is desirable for epitaxial semiconductor material 732 to be grown as a single-crystal material, i.e., templating from SOI layer 726, since a single-crystal material has a low resistance (as compared to a polycrystalline material). Therefore, through use of a single-crystal material, contact and serial resistance can be minimized in the completed FET. In practice, however, some of the single-crystal material deposited can grow from nanowire 728, which can have a different crystal structure from SOI layer 726. In that instance, epitaxial semiconductor material 732 will at most comprise two crystals, one grown from SOI layer 726 and the other grown from nanowire 728.

As the growth of epitaxial semiconductor material 732 from SOI layer 726 proceeds, the portions of nanowire 728 that extend out from the sacrificial gate will become encapsulated by the single-crystal material, thus merging nanowire 728 with SOI layer 726. The source and drain regions of the FET will also become thickened by this growth process. Though not indicated in step 704, this thickening process may leave source/drain regions directly over nanowire 728 thicker than source/drain regions immediately adjacent to nanowire 728.

The growth of epitaxial semiconductor material 732 can be accomplished using any suitable epitaxial growth techniques, such as rapid thermal CVD or ultra-high vacuum CVD (UHV-CVD). The growth temperature and precursors are chosen to enable selective growth. For example, selective Si epitaxy can be achieved using a $SiCl_4$ precursor in combination with growth temperatures in the range of between about 800° C. and about 950° C. Other precursors, such as dichlorosilane ($SiH_2Cl_2$) or a mixture of $SiH_4$ and hydrochloric acid (HCl) vapor can also be used with lower growth temperatures, e.g., down to about 700° C.

Alternatively, in the case of Ge epitaxy, selective growth can be obtained using a germane ($GeH_4$) precursor at temperatures as low as about 300° C. The growth of III-V semiconductors, such as gallium arsenide (GaAs) and indium phosphide (InP), can also be selective when growth methods such as metal-organic CVD and metal-organic molecular beam epitaxy (MOMBE) are used. Suitable III-V semiconductor precursors include, but are not limited to, trimethylindium (TMI) as an indium (In) source, triethylgallium (TEG) as a gallium (Ga) source, phosphine ($PH_3$) as a phosphorous (P) source and arsine ($AsH_3$) as an arsenic (As) source.

In step 706, sacrificial gate 730 is selectively removed. According to an exemplary embodiment, sacrificial gate 730 is removed by wet etching, e.g., with a diluted hydrofluoric acid (HF) solution. This etching exposes the channel region (see above) and surfaces of SOI layer 726 not covered by epitaxial semiconductor material 732.

In step 708, thermal oxidation is used to thin nanowire 728 in the channel region. Namely, one or more successive oxidation steps each followed by oxide stripping, can be used to bring the nanowire in the channel region down to a desired thickness. Performing the oxidation/oxide stripping in multiple steps permits incremental reductions in the nanowire thickness and thus provides for better control over the thinning process. By way of example only, a desired thickness of the nanowire in the channel region is between about one nm and about 10 nm, e.g., between about one nm and about five nm. Therefore, according to the present teachings, the nanowire can be grown having the smallest thickness the nanowire growth process allows (which will likely still be greater than the desired thickness). The nanowire can then be subsequently thinned in this step to achieve the desired thickness.

The final oxidation step can be performed without a counterpart oxide stripping to produce oxide layer 736 over a portion of nanowire 728 in the channel region (i.e., thinned portion 735) and over epitaxial semiconductor material 732 in the source and drain regions. This oxide layer can serve as a gate dielectric. Alternatively, a dielectric material, such as an oxynitride or hafnium dioxide ($HfO_2$), can be deposited to form the gate dielectric.

The thermal oxidation steps used to thin the nanowire and form the gate dielectric are also used to electrically isolate the source and drain regions. Namely, the formation of insulator 734, fully consuming the SOI layer below the channel region, establishes the nanowire channel as the sole conductive path connecting the source and drain regions. Insulator 734 which comprises, e.g., an oxide or a combination of solid and air gap dielectrics, isolates the source region from the drain region.

With the present teachings it is possible to configure the FET to have the gate surround the nanowire. This configuration provides better gate control in the completed FET. One way to achieve this configuration is through use of the successive oxidation/stripping steps, to generate a space between the SOI layer and the nanowire in the channel region. The nanowire will then be suspended in the channel region. The gate can then be formed around the nanowire according to the steps described below. It is notable that even if the gate does not completely encircle the nanowire (e.g., if the gate surrounds a majority of the nanowire, but does not go underneath the nanowire) this configuration will functionally emulate the gate completely encircling the nanowire.

At this stage in the fabrication process, the gate is formed. In the completed FET, the gate will control current through the nanowire channel. The gate can be formed in a number of different ways. Namely, the gate can be formed with at least a portion thereof overlapping the source and drain regions, as in steps 710 and 712. Alternatively, the gate can be formed so that it does not overlap the source and drain regions, as in steps 714 and 716.

For example, in step 710, gate 738 is formed by first blanket depositing a gate conductor over oxide layer 736 and then patterning the gate conductor, using lithography and etching, to form gate 738. As described above, suitable gate conductors include, but are not limited to, one or more of doped poly-Si, a metal, a metal alloy and a metal-semiconductor alloy. A metal gate is preferable in applications where a high-K gate dielectric is being employed. Forming a gate, such as gate 738, over the nanowire channel is referred to herein as top-gating.

As described above, gate 738 can comprise poly-Si. To fabricate a poly-Si gate, a poly-Si film can be first blanket deposited over oxide layer 736. The poly-Si film can be masked with the location and footprint of the gate, and selective reactive ion etching (RIE) (e.g., HBr-based chemistry) performed to define gate 738, with oxide layer 736 acting as an etch stop.

Spacers 740, which can comprise an insulating nitride, an oxide, an oxynitride or multilayers thereof (as described above), are then formed adjacent to gate 738, e.g., by deposition and etching. Self-aligned ion-implantation is then used to implant n-type and/or p-type doping agents into the source and drain regions, i.e., as indicated by arrows 742 and 744, respectively. Suitable n-type doping agents include, but are not limited to, P and As. Suitable p-type doping agents include, but are not limited to, boron (B) and In. Rapid thermal annealing can be used to activate the dopants and anneal out implant damage. Since the portion of the nanowire within the channel region is covered by the gate, that portion of the nanowire remains undoped. The exposed regions of oxide layer 736 are then stripped to prepare for metal-semiconductor alloy formation (see step 712, described below).

In step 712, a self-aligned metal-semiconductor alloy 746, e.g., a silicide, is formed over the source and drain regions, and over gate 738 (if gate 738 comprises poly-Si, i.e., rather than a metal). Specifically, after stripping the exposed regions of oxide layer 736 (in step 710, described above), a metal such as Ni, Co and/or Ti is blanket deposited over the source/drain regions and the gate. The assembly is then annealed to allow the metal to react with the exposed Si over the source/drain region and the gate. The metal over non-Si surfaces (e.g., over spacers 740) remains unreacted. A selective etch is then used to remove the unreacted metal, leaving metal-semiconductor alloy 746 over the source/drain regions and the gate.

As an example, when Ni is used as the alloy metal, a lower resistivity metal-semiconductor alloy phase is NiSi, which forms at an annealing temperature of about 420° C. The etch chemistry used to remove unreacted Ni is hydrogen peroxide ($H_2O_2$):sulfuric acid ($H_2SO_4$) 10:1 at 65° C. for 10 minutes. Any standard back end of line (BEOL) processing steps can now be performed, as needed, to complete the FET.

Alternatively, in step 714, a gate conductor is first blanket deposited over oxide layer 736, and then selectively polished, e.g., by chemical mechanical polishing (CMP), to form gate 748. Oxide layer 736 is used as a CMP stop layer, which implies that the polish rate of oxide layer 736 is substantially smaller than that of the gate conductor. With gate 748, a gate to source and/or drain overlap is minimized thereby reducing a gate to source and a gate to drain overlap capacitance. In the completed FET, gate 748 will control current through the nanowire channel.

In step 716, self-aligned ion-implantation is used to implant doping agents into the source and drain regions. As above, since the portion of the nanowire within the channel region is covered by the gate, that portion of the nanowire remains undoped. A self-aligned metal-semiconductor alloy 750 is then formed over the source and drain regions, and over gate 748. As described above, a metal such as Ni, Co and/or Ti can be blanket deposited over the source/drain regions and the gate. The assembly is then annealed to allow the metal to react with the exposed Si over the source/drain region and the gate, followed by a selective etching to remove the unreacted metal, leaving metal-semiconductor alloy 750 over the source/drain regions and the gate. Any standard BEOL processing steps can now be performed, as needed, to complete the FET.

Figure 8:
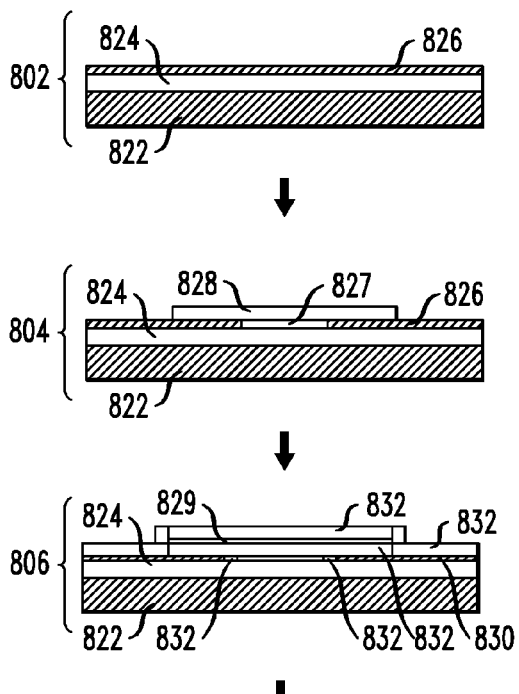
FIG. 8 is a diagram illustrating another exemplary methodology for fabricating a FET having a nanowire channel according to an embodiment of the present invention.
Figure 8:
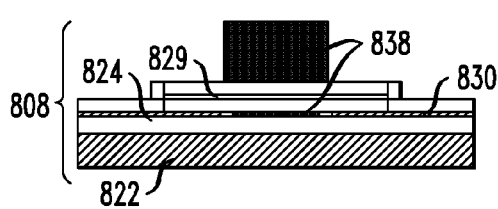
Figure 8:
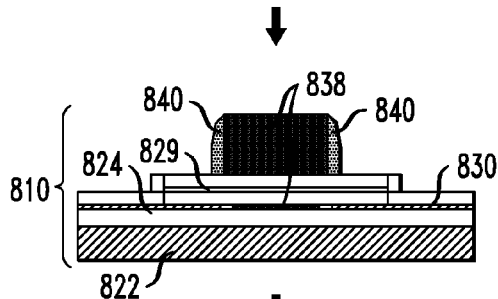
Figure 8:
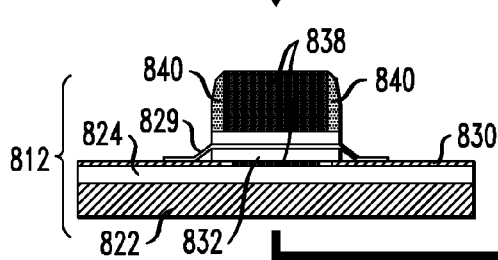
Figure 8:
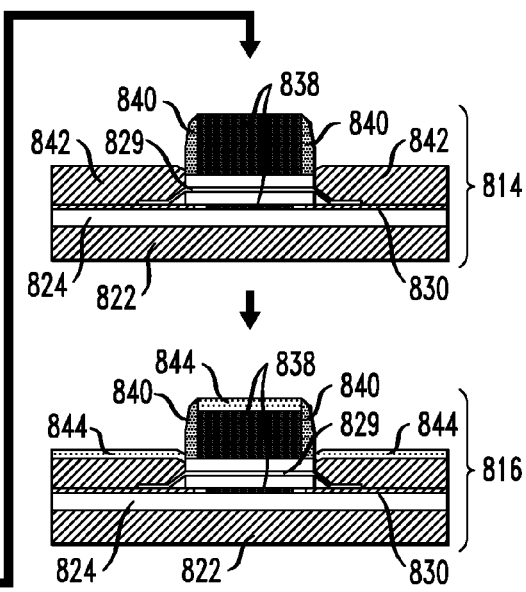

FIG. 8 is a diagram illustrating exemplary methodology 800 for fabricating a FET having a nanowire channel. As will be apparent from the following description, methodology 800 involves forming a source and drain region of the FET after a gate is fabricated.

For ease of depiction, the structures shown illustrated in FIG. 8 are not drawn to scale. Further, the cross-sectional views shown in FIG. 8 depict the fabrication of a single FET having a single nanowire channel. It is to be understood, however, that the FET may comprise multiple nanowire channels fabricated according to the techniques presented herein. Further, multiple FETs, each FET having at least one nanowire channel, may be fabricated on a common wafer according to the techniques provided herein.

As above, the following description will be based on the use of Si nanowires and Si processing. However, it is to be understood that the present teachings are applicable to the use of other semiconductor materials, such as Ge or III-V semiconductors (with, for example, growth temperature and dopant species adapted to the specific semiconductor material used).

In step 802, a substrate 822 is provided. Substrate 822 comprises BOX layer 824 and SOI layer 826 over BOX layer 824. SOI layer 826 can be formed over BOX layer 824 using conventional oxygen implantation or wafer bonding processes.

In step 804, trench 827 is formed in SOI layer 826, exposing BOX layer 824. According to an exemplary embodiment, trench 827 is formed like an STI trench, except that no filling of trench 827 is required since the thickness of SOI layer 826 is chosen to be thin. Further, by not filling the trench the gate can wrap around the nanowire (as described below). As such, trench 827 will be formed having a depth that is the same as the thickness of SOI layer 826. Trench 827 serves to isolate a source region from a drain region of the FET, thus making the nanowire channel the sole conductive path connecting the source and drain regions.

An undoped semiconductor nanowire, i.e., nanowire 828, is then deposited on SOI layer 826, so as to cross over trench 827. Nanowire 828 will serve as the channel of the FET. Nanowires, nanowire dimensions and exemplary processes for forming nanowires were described in detail, for example, in conjunction with the description of FIG. 7, above. For ease of depiction, a single nanowire 828 is shown. However, when multiple FETs are being formed, multiple nanowires would be deposited over SOI layer 826, crossing trench 827.

In step 806, thermal oxidation is used to thin the nanowire, resulting in thinned nanowire 829. Namely, one or more successive oxidation steps each followed by oxide stripping, can be used to bring the nanowire down to a desired thickness. Desired nanowire thicknesses were described, for example, in conjunction with the description of FIG. 7, above. Performing the oxidation/oxide stripping in multiple steps permits incremental reductions in the nanowire thickness and thus provides for better control over the thinning process.

The thermal oxidation process used to thin the nanowire also serves to consume at least a portion of, and thereby thin, the SOI layer, resulting in thinned SOI layer 830. Therefore, this thinning should be taken into account when choosing the initial SOI layer thickness. A final oxidation step, i.e., without a counterpart oxide stripping, is then performed to produce an oxide layer 832 surrounding the nanowire, covering exposed portions of the SOI layer and lining the sidewalls of the trench. This oxide layer can serve as a gate dielectric. Alternatively, a dielectric material, such as an oxynitride or $HfO_2$, can be deposited to form the gate dielectric.

In step 808, gate 838 is formed. In the completed FET, gate 838 will control current through the nanowire channel. Gate 838 distinguishes a channel region of the FET from a source and drain region of the FET. Namely, a portion of the nanowire within gate 838 will form the channel region of the FET. Portions of the nanowire extending out from gate 838, as well as sections of the SOI layer to either side of gate 838, will form source/drain regions of the FET. According to an exemplary embodiment, gate 838 is formed by first blanket depositing a gate conductor and then patterning the gate conductor, using lithography and etching, to form gate 838 that surrounds the nanowire channel. As described above, suitable gate conductors include, but are not limited to, one or more of doped poly-Si, a metal, a metal alloy and a metal-semiconductor alloy. A gate, such as gate 838, that is deposited all around the nanowire channel is referred to herein as an all-around gate.

In step 810, spacers 840 are formed adjacent to gate 838, e.g., by deposition and etching. As described above, spacers 840 can comprise an insulating nitride, an oxide, an oxynitride or multilayers thereof.

In step 812, oxide layer 832 is selectively removed from all areas of the FET, except where oxide layer 832 is covered by gate 838/spacers 840. This selective removal of the oxide layer can be accomplished, for example, using oxide-selective RIE, or by etching in diluted HF. As a result, portions of the nanowire that extend out from the gate are exposed, as is a top surface of the SOI layer. These exposed portions of the nanowire, with no support underneath, will bend down towards and make contact with the top surface of the SOI layer, as shown in step 812. The nanowire is attracted to the surface of the SOI layer by van-der Waals like forces. However, even if the nanowire is too stiff to bend, the merging of the nanowire with the SOI layer by epitaxy can still be achieved.

In step 814, a single-crystal semiconductor material 842 is epitaxially and selectively grown from SOI layer 830 (i.e., single-crystal semiconductor material 842 is grown on SOI layer 830 and SOI layer 830 serves as a template for the growth) in the source and drain regions. According to an exemplary embodiment, nanowire 829 comprises Si and the single-crystal deposited material comprises either Si or SiGe. According to another exemplary embodiment, the single-crystal deposited material has at least one chemical element different from the nanowire channel. By way of example only, the nanowire can comprise Si and single-crystal deposited material can comprise SiGe. Growth parameters are preferably chosen to attain selective growth of epitaxial semiconductor material 842 only over surfaces of SOI layer 830/nanowire 829, and not over gate 838/spacers 840.

It is desirable for epitaxial semiconductor material 842 to be grown as a single-crystal material, i.e., from SOI layer 830, since a single-crystal material has low resistance (as compared to a polycrystalline material). Therefore, through use of a single-crystal material, contact and serial resistance can be minimized in the completed FET. In practice, however, some of the material deposited can grow from nanowire 829 which can have a different crystal structure from SOI layer 830. In that instance, epitaxial semiconductor material 842 will at most comprise two crystals, one grown from SOI layer 830 and the other grown from nanowire 829.

The growth of epitaxial semiconductor material 842 from SOI layer 830 will serve to thicken the source and drain regions (forming raised source and drain regions) and will encapsulate the portions of nanowire 829 that extend out from gate 838 (thus merging nanowire 829 with SOI layer 830). As described above, the growth of some of the deposited material will be templated from nanowire 829. This growth from nanowire 829 will serve to thicken the portions of nanowire 829 that extend out from gate 838. The parameters for epitaxial growth were described in detail, for example, in conjunction with the description of FIG. 7, above.

Self-aligned ion-implantation is then used to implant doping agents into the source and drain regions. Suitable n-type doping agents include, but are not limited to, P and As. Suitable p-type doping agents include, but are not limited to, B and In. Rapid thermal annealing can be used to activate the dopants and anneal out implant damage. Since the portion of the nanowire within the channel region is surrounded by the gate, that portion of the nanowire remains undoped.

In step 816, a self-aligned metal-semiconductor alloy 844, e.g., a silicide, is formed over the source and drain regions, and over gate 838 (i.e., if gate 838 comprises poly-Si). According to an exemplary embodiment, a metal such as Ni, Co or Ti is blanket deposited over the source/drain regions and the gate. The assembly is then annealed to allow the metal to react with the exposed Si over the source/drain region and the gate. The metal over non-Si surfaces (e.g., over spacers 840) remains unreacted. A selective etch is then used to remove the unreacted metal, leaving metal-semiconductor alloy 844 over the source/drain regions and the gate.

As an example, when Ni is used as the alloy metal, a lower resistivity metal-semiconductor alloy phase is NiSi, which forms at an annealing temperature of about 420° C. The etch chemistry used to remove unreacted Ni is $H_2O_2$: $H_2SO_4$ 10:1 at 65° C. for 10 minutes. Any standard BEOL processing steps can now be performed, as needed, to complete the FET.

Figure 9B:
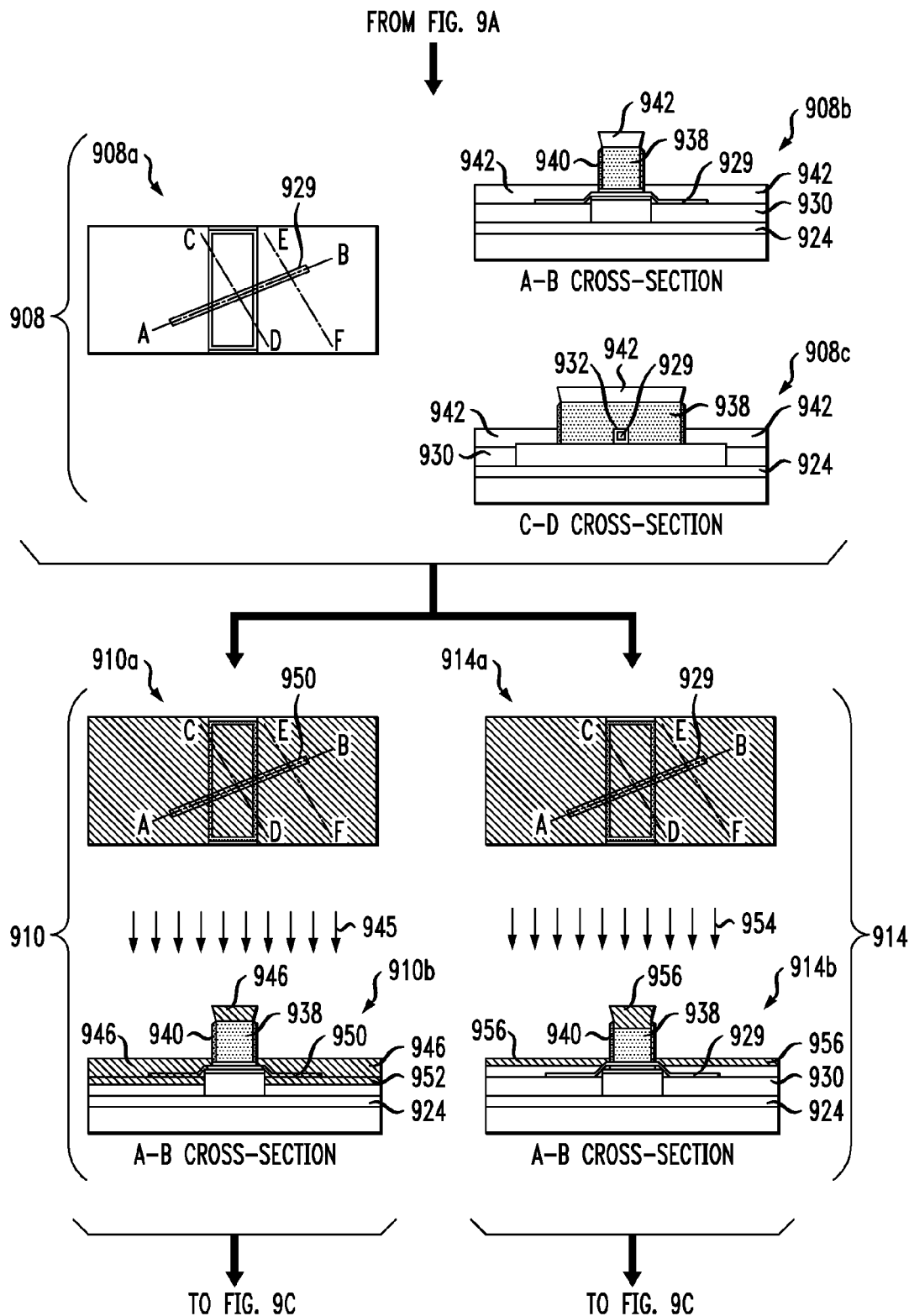
Figure 9C:
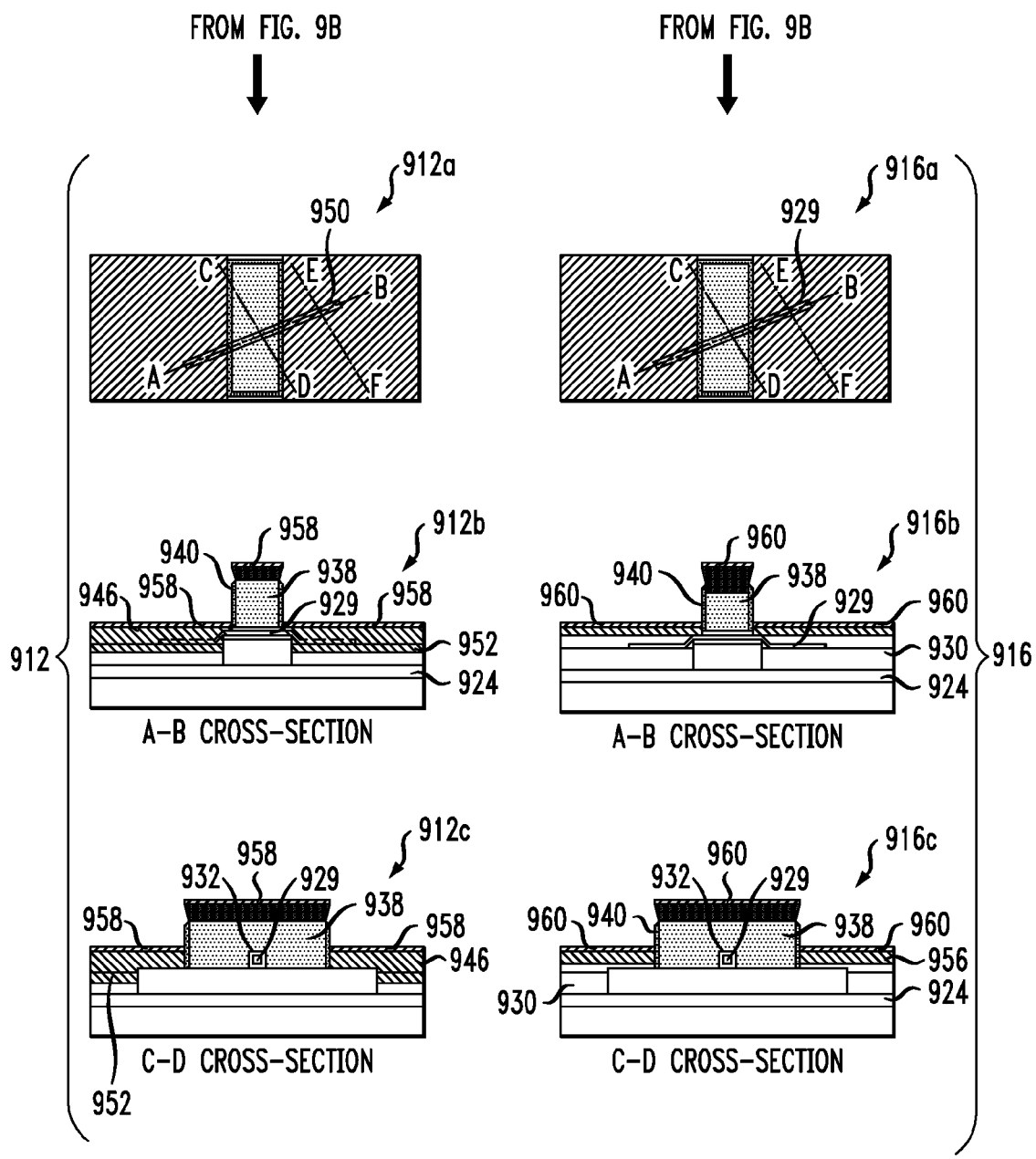

FIGS. 9A-C are diagrams illustrating exemplary methodology 900 for fabricating a FET having a nanowire channel. As will be apparent from the following description, methodology 900 involves forming source and drain regions of the FET after a gate has been fabricated.

For ease of depiction, the structures shown illustrated in FIGS. 9A-C are not drawn to scale. Further, FIGS. 9A-C depict the fabrication of a single FET having a single nanowire channel. It is to be understood, however, that the FET may comprise multiple nanowires channels fabricated according to the techniques presented herein. Further, multiple FETs, each FET having at least one nanowire channel, may be fabricated on a common wafer according to the techniques presented herein.

As above, the following description will be based on the use of Si nanowires and Si processing. However, it is to be understood that the present teachings are applicable to the use of other semiconductor materials, such as Ge or III-V semiconductors (with, for example, growth temperature and dopant species adapted to the specific semiconductor material used).

In step 902, as shown in top-down view 902a, in cross-sectional view 902b through plane A-B and in cross-sectional view 902c through plane C-D, a substrate 922 is provided. Substrate 922 comprises BOX layer 924 and SOI layer 926 over BOX layer 924. SOI layer 926 can be formed over BOX layer 924 using conventional oxygen implantation or wafer bonding processes.

STI region 927 is formed in SOI layer 926. STI region 927 comprises a dielectric, e.g., an oxide, filled trench and serves to isolate a source region from a drain region of the FET, thus making the nanowire channel the sole conductive path connecting the source and drain regions.

Alternatively, the substrate can be a bulk, e.g., Si, substrate. In that instance, the STI region would comprise a bulk-like STI region, so as to get proper isolation in a bulk substrate. The BOX layer would be optional. The remainder of methodology 900, presented below with regard to an SOI layer, would then proceed as described, however, with the bulk substrate instead of an SOI layer.

An undoped semiconductor nanowire, i.e., nanowire 928, is then deposited on SOI layer 926, so as to cross over STI region 927. Nanowire 928 will serve as the channel of the FET. As shown in step 902, the nanowire does not have to be placed exactly perpendicular to the STI region so long as the nanowire overlaps the SOI layer on both sides of the STI region. Nanowires, nanowire dimensions and exemplary processes for forming nanowires were described in detail, for example, in conjunction with the description of FIG. 7, above. For ease of depiction, a single nanowire 928 is shown. However, when multiple FETs are being formed, multiple nanowires would be deposited, e.g., using spin coating, over SOI layer 926, crossing STI region 927.

In step 904, as shown in top-down view 904a, in cross-sectional view 904b through plane A-B and in cross-sectional view 904c through plane C-D, thermal oxidation is used to thin the nanowire, resulting in thinned nanowire 929. Namely, one or more successive oxidation steps each followed by oxide stripping, can be used to bring the nanowire down to a desired thickness. Desired nanowire thicknesses were described, for example, in conjunction with the description of FIG. 7, above. Performing the oxidation/oxide stripping in multiple steps permits incremental reductions in the nanowire thickness and thus provides for better control over the thinning process.

The thermal oxidation process used to thin the nanowire also serves to consume at least a portion of, and thereby thin, the SOI layer, resulting in thinned SOI layer 930. Therefore, this thinning should be taken into account when choosing the initial SOI layer thickness. The thermal oxidation process used to thin the nanowire and the SOI layer also serves to consume at least a portion of, and thereby thin, the STI region oxide, thereby recessing the oxide in the STI region trench.

A final oxidation step, i.e., without a counterpart oxide stripping, is then performed to produce an oxide layer 932 covering exposed portions of the SOI layer and surrounding the nanowire. This oxide layer can serve as a gate dielectric. Alternatively, a dielectric material, such as an oxynitride or $HfO_2$, can be deposited to form the gate dielectric.

A gate 938 is then formed. In the completed FET, gate 938 will control current through the nanowire channel. Gate 938 distinguishes a channel region of the FET from a source and a drain region of the FET. Namely, a portion of the nanowire below gate 938 will form the channel region of the FET. Portions of the nanowire extending out from gate 938, as well as sections of the SOI layer to either side of gate 938, will form source/drain regions of the FET. According to an exemplary embodiment, gate 938 is formed by first blanket depositing a gate conductor. As described above, suitable gate conductors include, but are not limited to, one or more of doped poly-Si, a metal, a metal alloy and a metal-semiconductor alloy. Dopants can be implanted into the gate conductor, the gate conductor can then be masked with the location and footprint of the gate, i.e., by mask 937, and selective RIE performed to define gate 938.

In step 906, as shown in top-down view 906a, in cross-sectional view 906b through plane A-B and in cross-sectional view 906c through plane C-D, spacers 940 are formed on all sides of gate 938. According to an exemplary embodiment, spacers 940 are formed by blanket depositing a spacer material, such as silicon nitride ($Si_3N_4$), and etching the spacer material using RIE. RIE serves to remove the blanket deposited spacer material from all exposed planar surfaces.

Oxide layer 932 (deposited in step 904, described above) is then removed, except from portions of the nanowire covered by the gate/spacers. According to an exemplary embodiment, oxide layer 932 is removed using oxide-selective RIE and/or wet etching, e.g., with a diluted HF solution. For example, oxide-selective RIE can be used to remove the bulk of oxide layer 932 followed by a more gentle wet etching to prevent consuming the SOI layer/nanowire. As shown in cross-sectional view 906d through plane E-F, a magnified view 907 of a portion of the nanowire that extends out from the gate/spacers reveals that the nanowire can in fact have a multi-faceted shape that blocks the removal of some of the blanket deposited spacer material by the RIE (see description of the formation of spacers 940, above). Thus, after the oxide layer is removed, some residual spacer material, i.e., residual spacer material 941, can remain under the nanowire. In this instance, an additional cleaning step will be needed to remove the residual spacer material from under the nanowire.

In step 908, as shown in top-down view 908a, in cross-sectional view 908b through plane A-B and in cross-sectional view 908c through plane C-D, a single-crystal semiconductor material 942 is epitaxially and selectively grown from SOI layer 930 (i.e., single-crystal semiconductor material 942 is grown on SOI layer 930 and SOI layer 930 serves as a template for the growth) in the source and drain regions. According to an exemplary embodiment, nanowire 929 comprises Si and the single-crystal deposited material comprises either Si or SiGe. According to another exemplary embodiment, the single-crystal deposited material has at least one chemical element different from the nanowire channel. By way of example only, the nanowire can comprise Si and single-crystal deposited material can comprise SiGe. In this embodiment, a SiGe-on-insulator (SGOI) layer can be substituted for the SOI layer, therefore providing a SiGe template for growing a single-crystal deposited SiGe material.

As compared to FIGS. 7 and 8, described above, growth of epitaxial semiconductor material 942 will also be permitted over gate 938. The growth of epitaxial semiconductor material 942 from SOI layer 930 will serve to thicken the source and drain regions (forming raised source and drain regions) and will encapsulate the portions of nanowire 929 that extend out from gate 938 (thus merging nanowire 929 with SOI layer 930).

At this point in the method, ion implantation will be performed to amorphize at least a portion of the epitaxial semiconductor material, and in some cases portions of the nanowire and/or the SOI layer. As described above, a single crystal structure is preferable to minimize series/contact resistance. Thus, steps will be performed to recrystallize the amorphized regions. This can be carried out in a number of different ways.

For example, in step 910 (described below), the ion implantation will amorphize the epitaxial semiconductor material, the portions of the nanowire that extend out from the gate and a portion of the SOI layer. Solid phase epitaxy will then be used to recrystallize the amorphized regions with the non-amorphized portion of the SOI layer as a template. Alternatively, in step 914 (described below), the ion implantation will amorphize only a portion of the epitaxial semiconductor material. Solid phase epitaxy will then be used to recrystallize the amorphized epitaxial semiconductor material with the non-amorphized portion of the epitaxial semiconductor material as a template.

Specifically, in step 910, as shown in top-down view 910a and in cross-sectional view 910b through plane A-B, ion implantation (as indicated by arrows 945) is performed to amorphize the epitaxial semiconductor material (both on top of the gate and in the source and drain regions), the portions of the nanowire that extend out from the gate and a portion of the SOI layer, resulting in amorphized epitaxial semiconductor material 946, amorphized portions 950 of the nanowire and amorphized portion 952 of the SOI layer, respectively. According to an exemplary embodiment, amorphizing ions, e.g., Si or Ge, are first implanted into the source and drain regions to amorphize the source and drain regions. A non-amorphizing p-type dopant, such as B is then implanted into the amorphized source and drain region. This sequence is preferred, as amorphizing the source and drain regions first prevents the later-introduced n-type/p-type dopants from channeling through the material. Alternatively, an amorphizing n-type or p-type dopant can be used to complete the amorphization and doping in one step. For example, dopants such as boron-fluoride ($BF_2$), In (p-type), P and As (n-type) are amorphizing in the dose level typically required to dope the source and drain regions. For these dopants, a pre-amorphizing Si or Ge implantation is not necessary.

Solid phase epitaxy with rapid thermal annealing is then used to both recrystallize the amorphized regions (i.e., based on (e.g., templating from) the portion of the SOI layer that was not amorphized) and activate the dopants (as described above). As a result, a common single crystal structure will be present throughout the epitaxial semiconductor material, the portions of the nanowire that extend out from the gate and the SOI layer. The portion of the nanowire under the gate remains unchanged.

In step 912, as shown in top-down view 912a, in cross-sectional view 912b through plane A-B and in cross-sectional view 912c through plane C-D, a self-aligned metal-semiconductor alloy 958, e.g., a silicide, is formed over the source and drain regions, and over the gate. According to an exemplary embodiment, a metal such as Ni, Co and/or Ti is blanket deposited over the source/drain regions and the gate. The assembly is then annealed to allow the metal to react with the exposed Si over the source/drain region and the gate. The metal over non-Si surfaces (e.g., over spacers 940) remains unreacted. A selective etch is then used to remove the unreacted metal, leaving metal-semiconductor alloy 958 over the source/drain regions and the gate.

As an example, when Ni is used as the alloy metal, a lower resistivity metal-semiconductor alloy phase is NiSi, which forms at an annealing temperature of about 420° C. The etch chemistry used to remove unreacted Ni is $H_2O_2$: $H_2SO_4$ 10:1 at 65° C. for 10 minutes.

Alternatively, in step 914, as shown in top-down view 914a and in cross-sectional view 914b through plane A-B, ion implantation (as indicated by arrows 954) is performed to amorphize a portion of the epitaxial semiconductor material, resulting in amorphized portions 956 of the epitaxial semiconductor material. According to an exemplary embodiment, amorphizing ions, e.g., Si or Ge, are first implanted into the source and drain regions to amorphize the source and drain regions. A non-amorphizing dopant such as B is then implanted into the amorphized source and drain region. Alternatively, an amorphizing n-type or p-type dopant such as $BF_2$, In, P and As can be used to complete the amorphization and doping in one step.

Solid phase epitaxy with rapid thermal annealing is then used to both recrystallize the amorphized epitaxial semiconductor material (i.e., based on the portion of the epitaxial semiconductor material that was not amorphized) and activate the dopants (as described above). As a result, a common single crystal structure will be present throughout the epitaxial semiconductor material. This variation, described in step 914, can be used when there is good contact between the nanowire and the source/drain regions (i.e., there is no interfacial layer therebetween which can be tested electrically based on resistivity).

In step 916, as shown in top-down view 916a, in cross-sectional view 916b through plane A-B and in cross-sectional view 916c through plane C-D, a self-aligned metal-semiconductor alloy 960 is formed over the source and drain regions, and over the gate. According to an exemplary embodiment, a metal such as Ni, Co and/or Ti is blanket deposited over the source/drain regions and the gate. The assembly is then annealed to allow the metal to react with the exposed Si over the source/drain region and the gate. The metal over non-Si surfaces (e.g., over spacers 940) remains unreacted. A selective etch is then used to remove the unreacted metal, leaving metal-semiconductor alloy 960 over the source/drain regions and the gate.

As an example, when Ni is used as the alloy metal, a lower resistivity metal-semiconductor alloy phase is NiSi, which forms at an annealing temperature of about 420° C. The etch chemistry used to remove unreacted Ni is $H_2O_2$: $H_2SO_4$ 10:1 at 65° C. for 10 minutes.

Figure 10:
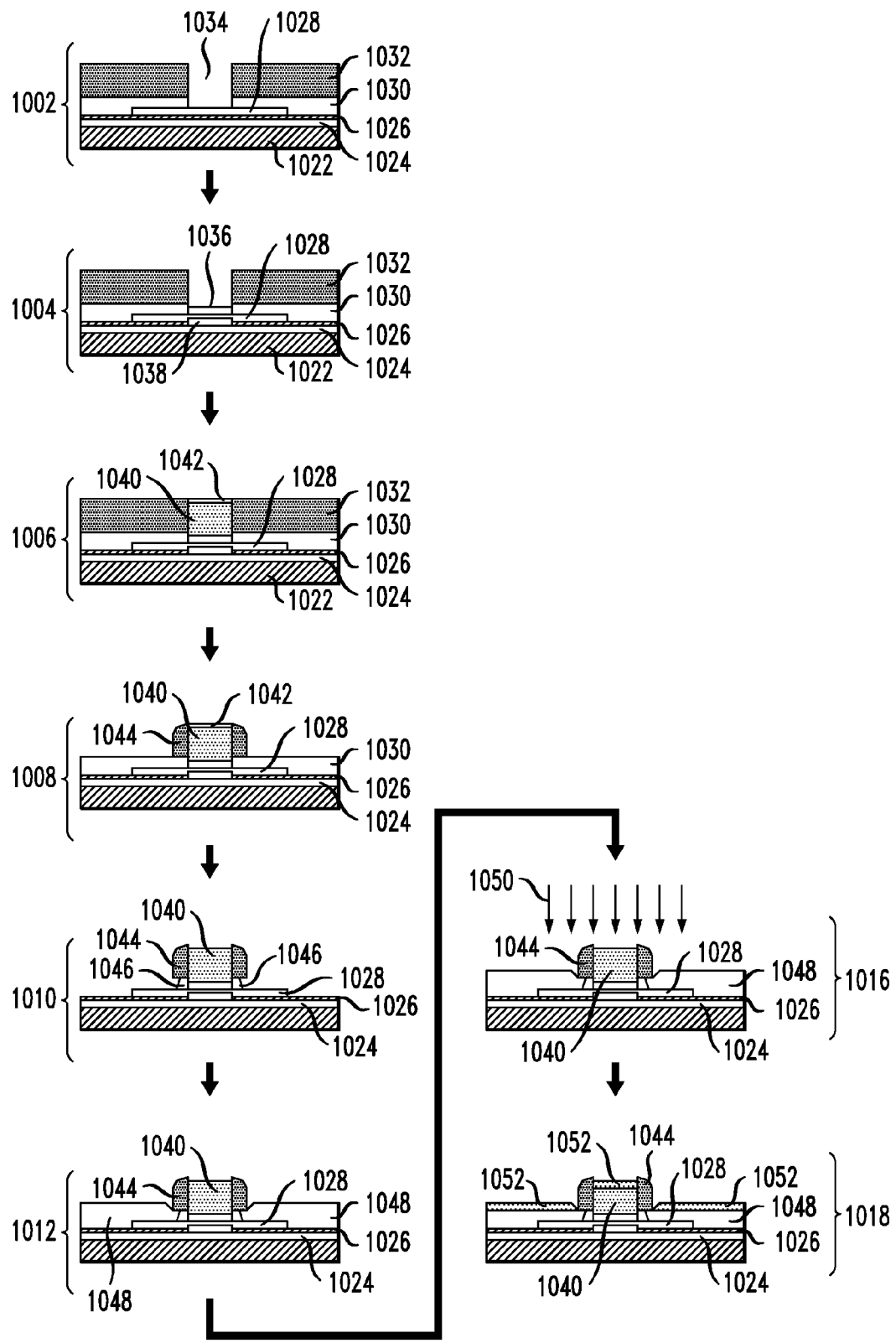
FIG. 10 is a diagram illustrating still another exemplary methodology for fabricating a FET having a nanowire channel according to an embodiment of the present invention.

FIG. 10 is a diagram illustrating exemplary methodology 1000 for fabricating a FET having a nanowire channel. As will be apparent from the following description, methodology 1000 involves forming source and drain regions of the FET after fabrication of a gate.

For ease of depiction, the structures shown illustrated in FIG. 10 are not drawn to scale. Further, the cross-sectional views shown in FIG. 10 depict the fabrication of a single FET having a single nanowire channel. It is to be understood, however, that the FET may comprise multiple nanowire channels fabricated according to the techniques presented herein. Further, multiple FETs, each FET having at least one nanowire channel, may be fabricated on a common wafer according to the techniques presented herein.

As above, the following description will be based on the use of Si nanowires and Si processing. However, it is to be understood that the present teachings are applicable to the use of other semiconductor materials, such as Ge or III-V semiconductors (with, for example, growth temperature and dopant species adapted to the specific semiconductor material used).

In step 1002, a substrate 1022 is provided. Substrate 1022 comprises BOX layer 1024 and SOI layer 1026 over BOX layer 1024. SOI layer 1026 can be formed over BOX layer 1024 using conventional oxygen implantation or wafer bonding processes.

An undoped semiconductor nanowire, i.e., nanowire 1028, is then deposited on SOI layer 1026. Nanowire 1028 will serve as a channel region of the FET. Nanowires, nanowire dimensions and exemplary processes for forming nanowires were described in detail, for example, in conjunction with the description of FIG. 7, above. For ease of depiction, a single nanowire 1028 is shown. However, in the instance when multiple FETs are being formed, multiple nanowires would be deposited over SOI layer 1026.

An oxide layer 1030 is deposited over SOI layer 1026/nanowire 1028. According to an exemplary embodiment, oxide layer 1030 comprises $SiO_2$ and has a thickness of between about five nanometers and about 25 nm. Nitride layer 1032 is then deposited over oxide layer 1030. According to an exemplary embodiment, nitride layer 1032 comprises $Si_3N_4$ and has a thickness of between about 40 nm and about 100 nm.

A trench 1034 is then formed through oxide layer 1030/nitride layer 1032. According to an exemplary embodiment, trench 1034 is formed using photolithography in combination with a two-step etching process. Namely, a photoresist is masked and patterned with the trench. Nitride-selective RIE is used to etch through nitride layer 1032. Oxide-selective RIE is then used to etch through oxide layer 1030. To prevent consuming the nanowire, the oxide-selective RIE can be stopped part-way through oxide layer 1030, and a more gentle wet etch, such as with a diluted HF solution, can be used to complete the trench. Trench 1034 will expose the nanowire in a channel region of the FET.

In step 1004, thermal oxidation is used to thin nanowire 1028 in the channel region. Namely, one or more successive oxidation steps each followed by oxide stripping, can be used to bring the nanowire in the channel region down to a desired thickness. Desired nanowire thicknesses were described, for example, in conjunction with the description of FIG. 7, above. Performing the oxidation/oxide stripping in multiple steps permits incremental reductions in the nanowire thickness and thus provides for better control over the thinning process.

The final oxidation step can be performed without a counterpart oxide stripping to produce oxide layer 1036 over nanowire 1028 in the channel region. This oxide layer can serve as a gate dielectric. Alternatively, a dielectric material, such as an oxynitride or $HfO_2$, can be deposited to form the gate dielectric.

The thermal oxidation steps used to thin the nanowire and form the gate dielectric are also used to isolate the source and drain regions. Namely, forming an oxide, i.e., oxide 1038, that fully consumes the SOI layer within the channel region, makes the nanowire the sole conductive path connecting the source and drain regions.

In step 1006, gate 1040 is formed. In the completed FET, gate 1040 will control current through the nanowire channel. Gate 1040 distinguishes a channel region of the FET from a source and drain region of the FET. Namely, a portion of the nanowire within gate 1040 will form the channel region of the FET. Portions of the nanowire extending out from gate 1040, as well as sections of the SOI layer to either side of gate 1040, will form source/drain regions of the FET. According to an exemplary embodiment, gate 1040 is formed by first blanket depositing a gate conductor over nitride layer 1032 and filling trench 1034. As described above, suitable gate conductors include, but are not limited to, one or more of doped poly-Si, a metal, a metal alloy and a metal-semiconductor alloy. CMP is then used to remove the gate conductor from the surface of nitride layer 1032. As such, gate 1040 is formed by a damascene process. It is also possible to use a fully silicided (FUSI) gate. In a FUSI process the poly-Si gate is fully silicided by reacting the poly-Si with a metal, forming silicide down to the oxide 1036 and 1038. It is notable that, since RIE is not used to define the gate (as in other embodiments described herein), then residual material left under the nanowire after RIE is avoided. See, for example, the description of step 906 of FIG. 9, above.

Thermal oxidation is used to form oxide cap 1042 over gate 1040 if poly-Si was used as the gate conductor. Oxide cap 1042 will serve to protect the gate, e.g., during spacer formation (see step 1008, described below). Gate may also be doped by ion-implantation, if needed.

In step 1008, spacers 1044 are formed on either side of gate 1040. Namely, nitride layer 1032 is selectively etched, e.g., using a hot phosphoric ($H_3PO_4$) etch. A blanket nitride film is deposited over the structure and blanket RIE is used to form spacers 1044. Oxide layer 1030 serves as an etch stop in this process.

In step 1010, oxide layer 1030 is removed. According to an exemplary embodiment, oxide layer 1030 is removed using oxide-selective RIE or oxide-selective RIE in combination with a wet etch, e.g., using a diluted HF solution (so as to prevent consuming the SOI layer/nanowire, as described above). The etching will also remove oxide cap 1042 from over gate 1040.

Select portions of oxide layer 1030 will remain under the spacers after the etching, i.e., portions 1046. These portions 1046, which are also spacers, will serve as a dielectric between the gate and the source/drain regions, and may have a lower dielectric constant than that of the nitride spacers 1044.

In step 1012, a single-crystal semiconductor material 1048 is epitaxially and selectively grown from SOI layer 1026 (i.e., single-crystal semiconductor material 1048 is grown on SOI layer 1026 and SOI layer 1026 serves as a template for the growth) in the source and drain regions. According to an exemplary embodiment, nanowire 1028 comprises Si and the single-crystal deposited material comprises either Si or SiGe. According to another exemplary embodiment, the single-crystal deposited material has at least one chemical element different from the nanowire channel. By way of example only, the nanowire can comprise Si and single-crystal deposited material can comprise SiGe. Growth parameters are preferably chosen to attain selective growth of epitaxial semiconductor material 1048 only over surfaces of SOI layer 1026/nanowire 1028, and not over gate 1040/spacers 1044.

It is desirable for epitaxial semiconductor material 1048 to be grown as a single-crystal material, i.e., from SOI layer 1026, since a single-crystal material has low resistance (as compared to a polycrystalline material). Therefore, through use of a single-crystal material, contact and serial resistance can be minimized in the completed FET. In practice, however, some of the material deposited can grow from nanowire 1028 which can have a different crystal structure from SOI layer 1026. In that instance, epitaxial semiconductor material 1048 will at most comprise two crystals, one grown from SOI layer 1026 and the other grown from nanowire 1028.

The growth of epitaxial semiconductor material 1048 from SOI layer 1026 will serve to thicken the source and drain regions (forming raised source and drain regions) and will encapsulate the portions of nanowire 1028 that extend out from gate 1040 (thus merging nanowire 1028 with SOI layer 1026). As described above, the growth of some of the deposited material will be templated from nanowire 1028. This growth from nanowire 1028 will serve to thicken the portions of nanowire 1028 that extend out from gate 1040. The parameters for epitaxial growth were described in detail, for example, in conjunction with the description of FIG. 7, above.

In step 1016, self-aligned ion-implantation is then used to implant doping agents into the source and drain regions (as indicated by arrows 1050). Suitable n-type doping agents include, but are not limited to, P and As. Suitable p-type doping agents include, but are not limited to, B and In. Rapid thermal annealing can be used to activate the dopants and anneal out implant damage. Since the portion of the nanowire within the channel region is surrounded by the gate, that portion of the nanowire remains undoped.

In step 1018, a self-aligned metal-semiconductor alloy 1052, e.g., a silicide, is formed over the source and drain regions, and over gate 1040 (i.e., if gate 1040 comprises poly-Si). According to an exemplary embodiment, a metal such as Ni, Co and/or Ti is blanket deposited over the source/drain regions and the gate. The assembly is then annealed to allow the metal to react with the exposed Si over the source/drain region and the gate. The metal over non-Si surfaces (e.g., over spacers 1044) remains unreacted. A selective etch is then used to remove the unreacted metal, leaving metal-semiconductor alloy 1052 over the source/drain regions and the gate. Any standard BEOL processing steps can now be performed, as needed, to complete the FET.

Figure 11:
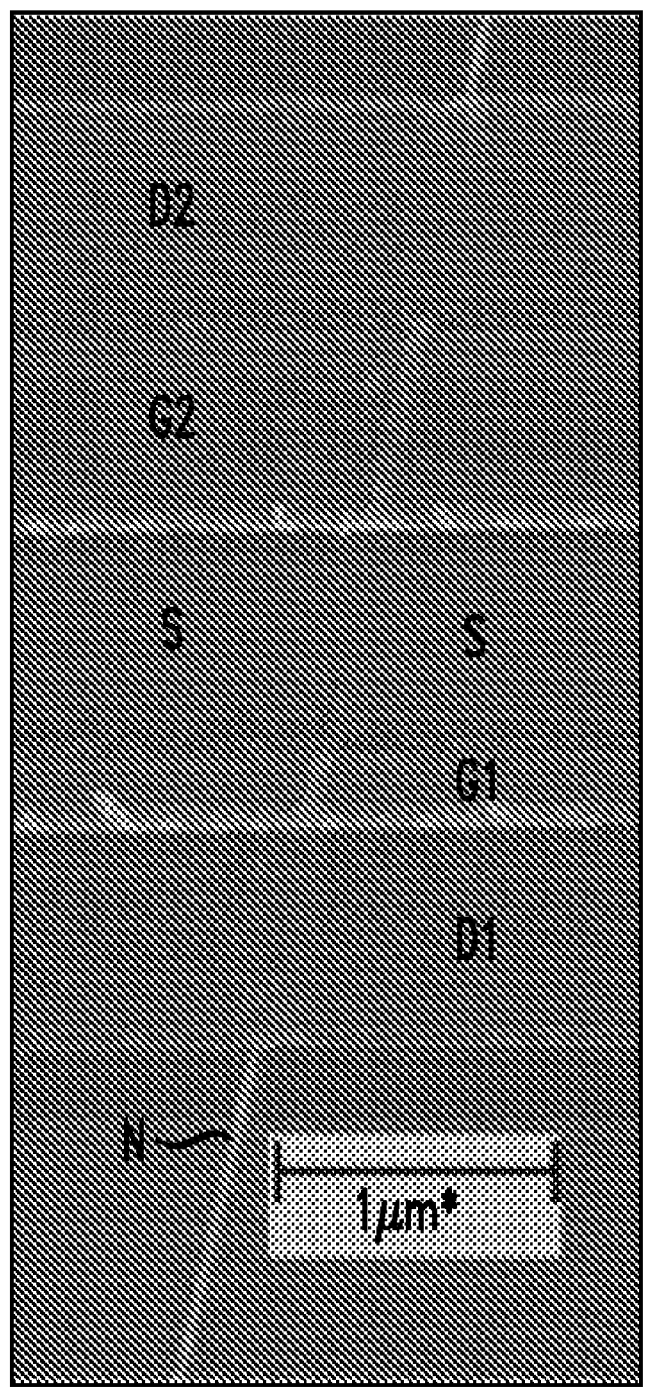
FIG. 11 is a diagram illustrating a top-down scanning electron microscope (SEM) image of exemplary FETs having a nanowire channel fabricated according to the methodology of FIG. 7 according to an embodiment of the present invention.

FIG. 11 is a diagram illustrating top-down scanning electron microscope (SEM) image 1106 of exemplary FETs having a nanowire channel fabricated according to the methodology of FIG. 7. Namely, in SEM image 1106, two FETs are shown, having single-crystal Si drains D1 and D2/source S (each with a Ni-based silicide), aluminum (Al) gates G1 and G2 and single nanowire channel N. By way of example only, with regard to the FET shown on the left side of SEM image 1106 (e.g., D1/G1/S), the gate has a length L of 234 nm, the nanowire has a diameter of 11.5±1.5 nm and a gate dielectric (between the gate and the nanowire (not shown)) has a thickness $t_{ox}$ of 12 nm. Gate length is measured as a length of the gate parallel to the nanowire.

Figure 12A:
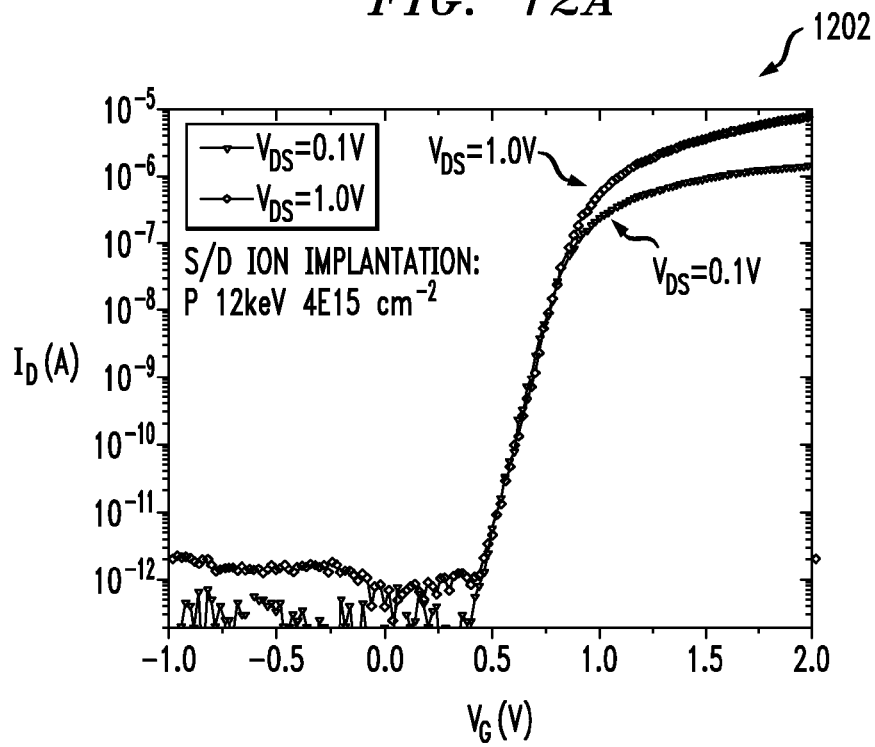
FIGS. 12A-B are diagrams illustrating electrical characteristics for the FET shown illustrated in FIG. 11 according to an embodiment of the present invention.
Figure 12B:
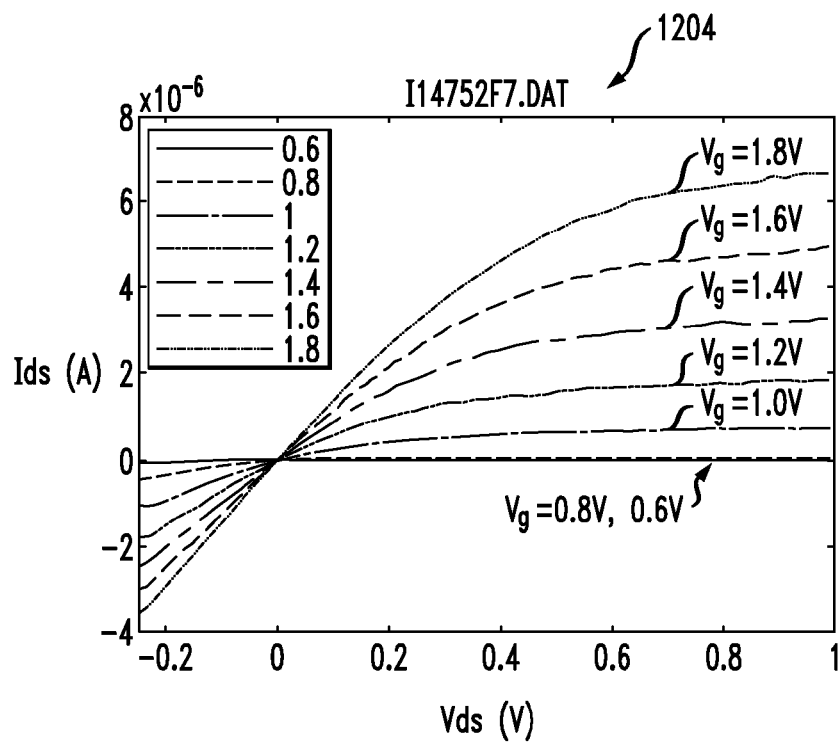

FIGS. 12A-B are diagrams illustrating electrical characteristics for the FET shown in SEM image 1106, described in conjunction with the description of FIG. 11, above. Namely, FIG. 12A is a diagram illustrating plot 1202 of drain current $I_D$ (measured in amps A) as a function of gate voltage $V_G$ (measured in volts V) for drain-source voltages of $V_{DS}$=0.1 V and a $V_{DS}$=1.0 V. FIG. 12B is a diagram illustrating plot 1204 of drain-source current IDS as a function of $V_{DS}$ for various different $V_G$ values.

Figure 13:
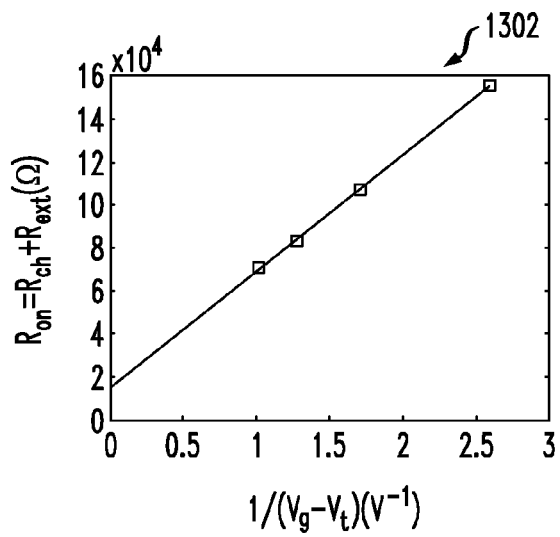
FIG. 13 is a diagram illustrating a plot of resistivity of an exemplary FET having a nanowire channel fabricated according to the methodology of FIG. 7 according to an embodiment of the present invention.

FIG. 13 is a diagram illustrating plot 1302 of resistivity in an exemplary nanowire FET fabricated according to methodology 700, described in conjunction with the description of FIG. 7, above. Specifically, in plot 1302, on-resistance $R_{on}$ is shown as a function of $1/(V_g-V_t)$. $R_{on}$ can be calculated as a sum of channel resistance $R_{ch}$ and external resistance $R_{ext}$ (e.g., source/drain region resistance), i.e., $R_{on}=R_{ch}+R_{ext}$, wherein $R_{ch}=L/W\mu_{eff}C_{ox}(V_g-V_t)$. L is gate length, W is FET width, $\mu_{eff}$ is electron mobility (i.e., surface mobility), $C_{ox}$ is gate capacitance, $V_g$ is gate voltage and $V_t$ is threshold voltage. Contact resistivity, namely contact resistance R×contact area A, thus equals between $1.1 \cdot 10^{-8}$ ohms per square centimeter ($\Omega \cdot cm^2$) and $2.7 \cdot 10^{-8} \Omega \cdot cm^2$ (i.e., R·A=1.1–$2.7 \cdot 10^{-8} \Omega \cdot cm^2$). In the extrapolation of $R_{ext}$, a constant leads resistance of 5.1 kilo ohms (k$\Omega$) was subtracted from the extrapolated value of $R_{ext}$. Also, the reported range of contact resistivities accounts for the error in extrapolating $V_t$.

Figure 14:
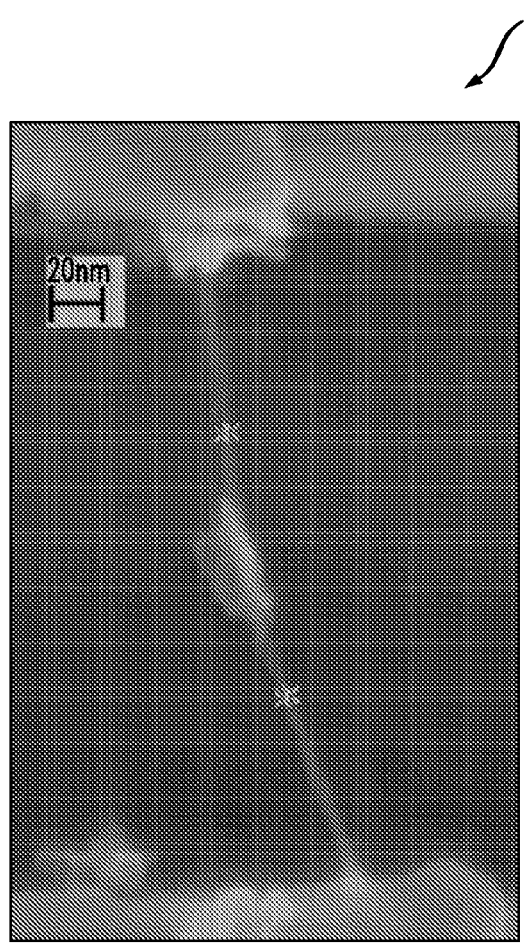
FIG. 14 is a diagram illustrating a top-down SEM image of an exemplary FET having a small diameter nanowire channel fabricated according to the methodology of FIG. 7 according to an embodiment of the present invention.
Figure 15:
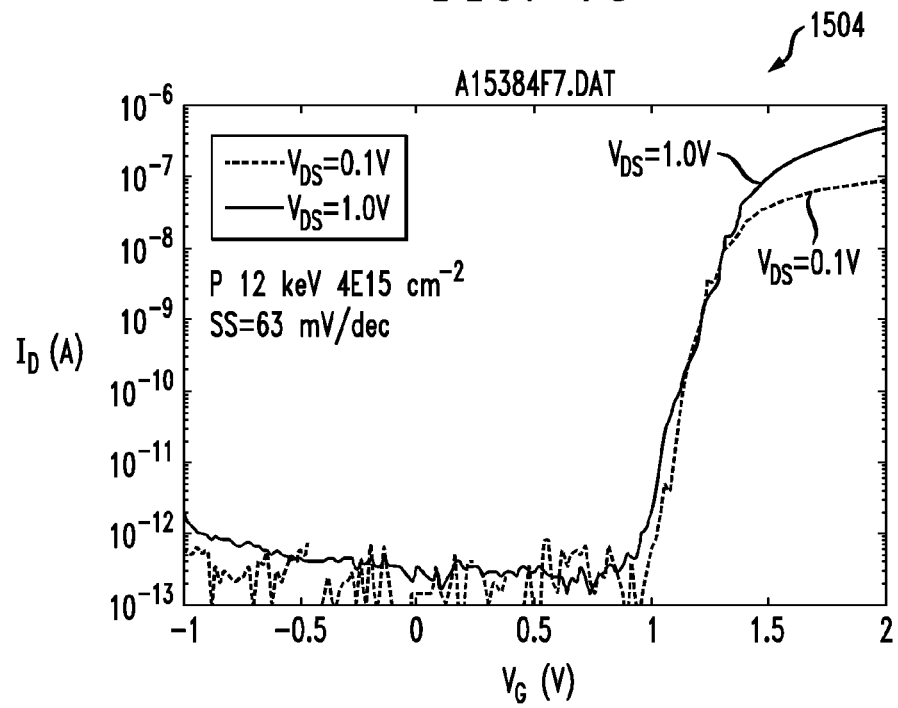
FIG. 15 is a diagram illustrating an exemplary plot of drain current as a function of gate voltage for the FET shown illustrated in FIG. 14 according to an embodiment of the present invention.

FIG. 14 is a diagram illustrating top-down SEM image 1402 of an exemplary FET having a small diameter nanowire channel fabricated according to the methodology of FIG. 7. SEM image 1402 shows the FET after a top gate and gate oxide (dielectric) have been removed. The nanowire channel has a diameter of about 3.5±1.5 nm. FIG. 15 is a diagram illustrating plot 1504 of drain current $I_D$ (measured in amps A) as a function of gate voltage $V_G$ (measured in volts V) for a drain-source voltage $V_{DS}$ of 0.1 V and a $V_{DS}$ of 1.0 V for the FET shown illustrated in FIG. 14.

Figure 16:
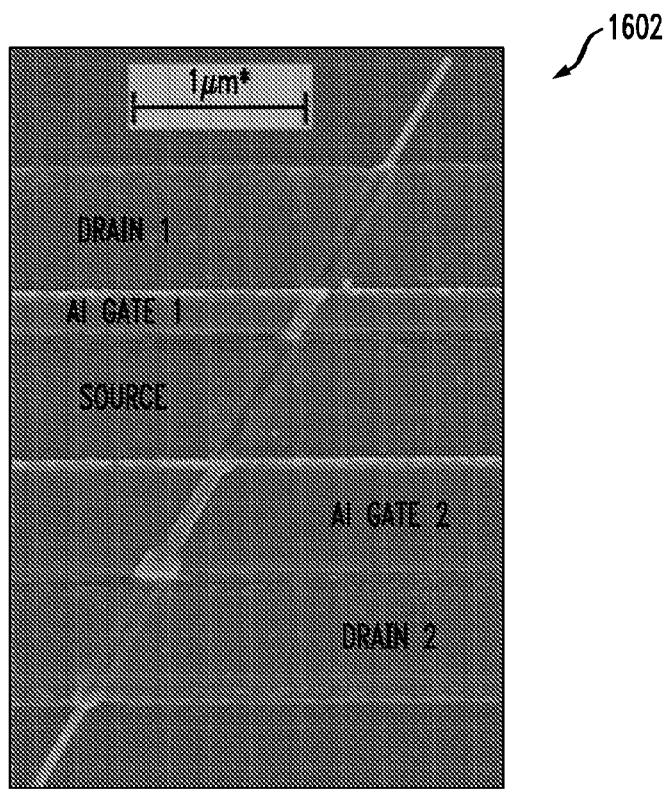
FIG. 16 is a diagram illustrating a top-down SEM image of exemplary FETs having two nanowire channels fabricated according to the methodology of FIG. 7 according to an embodiment of the present invention.

FIG. 16 is a diagram illustrating top-down SEM image 1602 of exemplary FETs having two nanowire channels fabricated according to the methodology of FIG. 7. Namely, in SEM image 1602, two FETs are shown having a single source, two drains (drain 1/drain 2), two Al gates (Al gate 1/Al gate 2) and two nanowire channels (only one of which is shown in SEM image 1602). By way of example only, with regard to the FET shown on the top half of SEM image 1602 (e.g., drain 1/Al gate 1/source), the gate has a length L of 264 nm, the nanowire has a diameter of 19.2 nm and a gate dielectric (not shown) has a thickness $t_{ox}$ of 15.4 nm.

Figure 17:
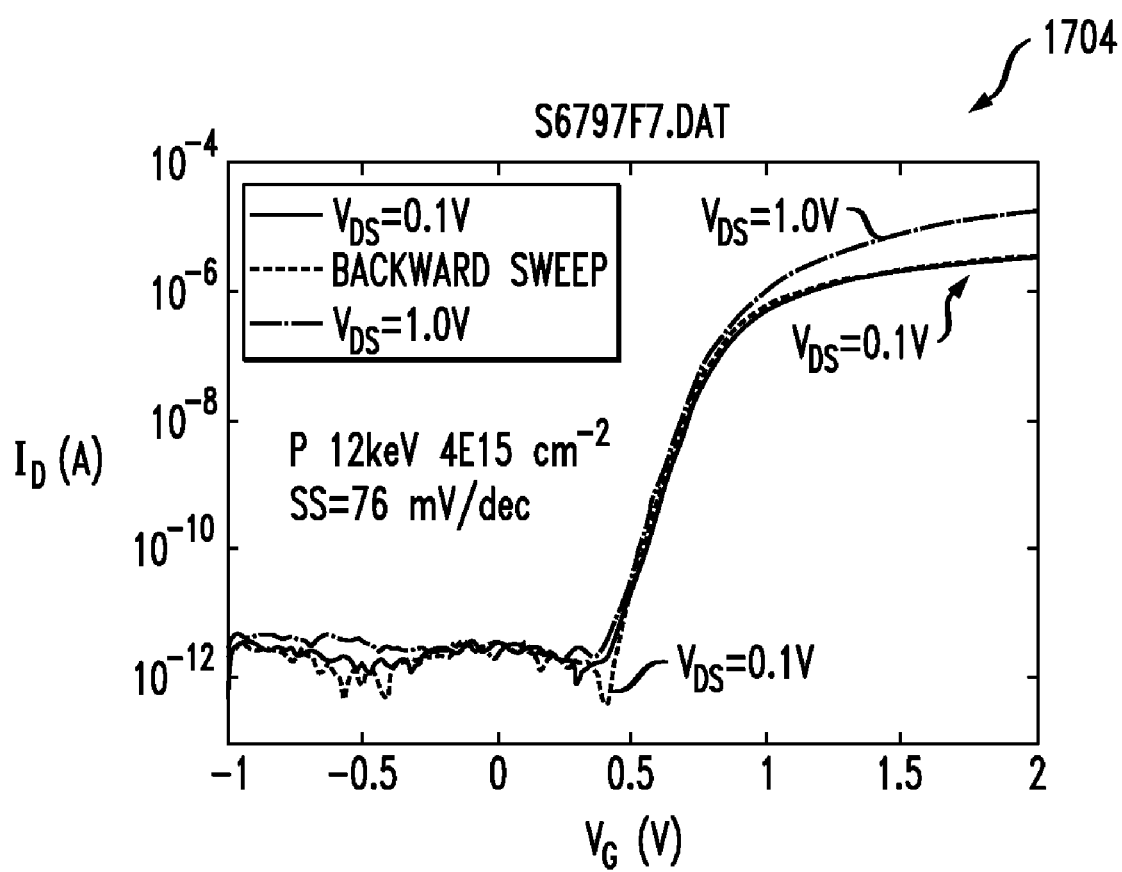
FIG. 17 is a diagram illustrating near hysteresis-free operation for the FET shown illustrated in FIG. 16 according to an embodiment of the present invention.

FIG. 17 is a diagram illustrating near hysteresis-free operation for the FET shown illustrated in FIG. 16. Namely, in plot 1704, drain current $I_D$ (measured in amps A) is shown as a function of gate voltage $V_G$ (measured in volts V) for a drain-source voltage $V_{DS}$ of 0.1 V and a $V_{DS}$ of 1.0 V for the FET, taken in a forward gate voltage sweep and a backward gate voltage sweep. Forward gate voltage sweep means that the gate voltage $V_G$ is swept from a negative to a positive bias, where a backward sweep means that $V_G$ is swept from a positive to a negative bias. Plot 1704 shows that there is very little hysteresis seen following forming gas anneal. A forming gas anneal is, e.g., an anneal in a mixture of nitrogen and hydrogen at a temperature of between about 400° C. and about 500° C. for a duration of between 30 minutes and 60 minutes.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a field-effect transistor (FET), the method comprising the steps of:

providing a substrate having a silicon-on-insulator (SOI) layer;

depositing at least one nanowire over the SOI layer;

forming a sacrificial gate over the SOI layer so as to cover a portion of the nanowire that forms a channel region;

selectively growing an epitaxial semiconductor material from the SOI layer that covers the nanowire and attaches the nanowire to the SOI layer in a source region and in a drain region;

removing the sacrificial gate;

forming an oxide that divides the SOI layer into at least two electrically isolated sections, one section included in the source region and the other section included in the drain region;

forming a gate dielectric layer over the channel region;

forming a gate over the channel region separated from the nanowire by the gate dielectric layer; and forming a metal-semiconductor alloy over the source and drain regions.

2. The method of claim 1, wherein the sacrificial gate comprises a low temperature oxide.

3. The method of claim 1, wherein the epitaxial semiconductor material comprises a single crystal structure templated from the SOI layer.

4. The method of claim 1, wherein the epitaxial semiconductor material comprises two crystal structures, one crystal structure templated from the SOI layer and the other crystal structure templated from the nanowire.

5. The method of claim 1, wherein the metal-semiconductor alloy comprises one or more of nickel, cobalt and titanium.

6. The method of claim 1, wherein the metal-semiconductor alloy comprises a silicide.

7. The method of claim 1, further comprising the step of forming spacers adjacent to the gate.

8. The method of claim 1, further comprising the step of doping the source and drain regions.

9. The method of claim 8, wherein the source and drain regions are doped using self-aligned ion-implantation.

10. The method of claim 1, further comprising the step of forming a metal-semiconductor alloy over the gate.

11. The method of claim 1, further comprising the step of removing portions of the gate that overlap the source region and the drain region.

12. The method of claim 11, wherein the portions of the gate that overlap the source region and the drain region are removed using chemical-mechanical polishing.

13. The method of claim 1, further comprising the step of thinning the portion of the nanowire that forms the channel region.

\* \* \* \* \*